United States Patent
Taoka

(10) Patent No.: US 8,464,192 B2
(45) Date of Patent: Jun. 11, 2013

(54) LITHOGRAPHY VERIFICATION APPARATUS AND LITHOGRAPHY SIMULATION PROGRAM

(75) Inventor: Hironobu Taoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/348,431

(22) Filed: Jan. 11, 2012

(65) Prior Publication Data

US 2012/0198393 A1 Aug. 2, 2012

(30) Foreign Application Priority Data

Jan. 27, 2011 (JP) ................................. 2011-015377

(51) Int. Cl.
G06F 17/50 (2006.01)
(52) U.S. Cl.
USPC ........................................................ 716/110
(58) Field of Classification Search
USPC .................................................. 716/100, 110
See application file for complete search history.

(56) References Cited

U.S. PATENT DOCUMENTS

| | | |
|---|---|---|
| 6,343,370 B1 | 1/2002 | Taoka et al. |
| 7,797,068 B2 | 9/2010 | Kyoh |
| 2001/0049811 A1 | 12/2001 | Taoka |
| 2010/0030545 A1 * | 2/2010 | Uno et al. ................ 703/13 |
| 2010/0037193 A1 | 2/2010 | Kyoh |
| 2011/0113396 A1 * | 5/2011 | Oh et al. ................. 716/113 |

FOREIGN PATENT DOCUMENTS

| | | |
|---|---|---|
| JP | 2000-182921 | 6/2000 |
| JP | 2001-350250 | 12/2001 |
| JP | 2008-028092 | 2/2008 |
| JP | 2010-026076 | 2/2010 |
| JP | 2010-040898 | 2/2010 |

* cited by examiner

*Primary Examiner* — Suchin Parihar
(74) *Attorney, Agent, or Firm* — McDermott Will & Emery LLP

(57) ABSTRACT

The present invention provides a lithography verification apparatus which executes high-precision lithography verification in consideration of the effects of individual errors integrated. Various information (simulation result, error standard, etc.) are input. A variation distribution value is calculated. The variation distribution value and a variation distribution error standard are compared to determine whether the variation distribution value is smaller than the error standard. The variation distribution error standard is a standard for a value or the like related to a standard deviation or the like for a dimensional displacement. When it is determined that the variation distribution value is smaller than the error standard, an error is determined not to exist, and the processing is ended. When it is determined that the variation distribution value is not smaller than the error standard, an error is determined to exist, and an error list and a variation distribution value are outputted.

7 Claims, 22 Drawing Sheets

FIG. 5

| ID | x | y | Δs | |Δs| |
|---|---|---|---|---|
| 1 | 167844 | 590489 | 1.7 | 1.7 |
| 2 | 279851 | 2657472 | 1.7 | 1.7 |
| 3 | 417339 | 1262166 | 1.7 | 1.7 |
| 4 | 516784 | 1330141 | 1.7 | 1.7 |
| 5 | 747853 | 1534567 | 4.5 | 4.5 |
| 6 | 756757 | 1795413 | 2.9 | 2.9 |
| 7 | 836399 | 1205747 | 1.5 | 1.5 |
| 8 | 980622 | 2305734 | 3.2 | 3.2 |
| 9 | 1019791 | 1739858 | 1.7 | 1.7 |
| 10 | 1038876 | 2751136 | 1.7 | 1.7 |
| 11 | 1311962 | 876005 | 6.6 | 6.6 |
| 12 | 1320401 | 2363968 | −2.2 | 2.2 |
| 13 | 1530778 | 2494530 | 1.7 | 1.7 |
| 14 | 1531764 | 2072296 | −3.4 | 3.4 |
| 15 | 1638711 | 1115047 | 1.7 | 1.7 |
| 16 | 1835188 | 2515437 | −6.3 | 6.3 |
| 17 | 1868530 | 2064068 | −4.3 | 4.3 |
| 18 | 1884419 | 897944 | 3.9 | 3.9 |
| 19 | 1898217 | 2455815 | 2.2 | 2.2 |
| 20 | 1935041 | 486907 | 4.4 | 4.4 |
| 21 | 2034154 | 2479254 | 5.6 | 5.6 |
| 22 | 2043484 | 1449450 | 1.7 | 1.7 |
| 23 | 2167718 | 849248 | −2.2 | 2.2 |
| 24 | 2197577 | 714225 | −1.5 | 1.5 |
| 25 | 2273922 | 58641 | −1.6 | 1.6 |
| 26 | 2401552 | 2031924 | −1.7 | 1.7 |
| 27 | 2542603 | 1874664 | 1.7 | 1.7 |
| 28 | 2712347 | 1750745 | 6.1 | 6.1 |
| 29 | 2838022 | 1114960 | 4.3 | 4.3 |
| 30 | 2859227 | 2950094 | −1.4 | 1.4 |

FIG. 12A

| ID | x | y | Δs | \|Δs\| | ε'const |
|---|---|---|---|---|---|
| 1 | 167844 | 590489 | 1.7 | 1.7 | 1.5 |
| 2 | 279851 | 2657472 | 1.7 | 1.7 | 1.5 |
| 3 | 417339 | 1262166 | 1.7 | 1.7 | 1.5 |
| 4 | 516784 | 1330141 | 1.7 | 1.7 | 1.5 |
| 5 | 747853 | 1534567 | 4.5 | 4.5 | 1.5 |
| 6 | 756757 | 1795413 | 2.9 | 2.9 | 1.5 |
| 7 | 836399 | 1205747 | 1.5 | 1.5 | 1.5 |
| 8 | 980622 | 2305734 | 3.2 | 3.2 | 1.5 |
| 9 | 1019791 | 1739858 | 1.7 | 1.7 | 1.5 |
| 10 | 1038876 | 2751136 | 1.7 | 1.7 | 1.5 |
| 11 | 1311962 | 876005 | 6.6 | 6.6 | 1.5 |
| 12 | 1320401 | 2363968 | -2.2 | 2.2 | -1.5 |
| 13 | 1530778 | 2494530 | -4.3 | 4.3 | -1.5 |
| 14 | 1531764 | 2072296 | -3.4 | 3.4 | -1.5 |
| 15 | 1638711 | 1115047 | 1.7 | 1.7 | 1.5 |
| 16 | 1835188 | 2515437 | -6.3 | 6.3 | -1.5 |
| 17 | 1868530 | 2064068 | -4.3 | 4.3 | -1.5 |
| 18 | 1884419 | 897944 | 3.9 | 3.9 | 1.5 |
| 19 | 1898217 | 2455815 | 2.2 | 2.2 | 1.5 |
| 20 | 1935041 | 486907 | 4.4 | 4.4 | 1.5 |
| 21 | 2034154 | 2479254 | 5.6 | 5.6 | 1.5 |
| 22 | 2043484 | 1449450 | 1.7 | 1.7 | 1.5 |
| 23 | 2167718 | 849248 | -2.2 | 2.2 | -1.5 |
| 24 | 2197577 | 714225 | -1.5 | 1.5 | -1.5 |
| 25 | 2273922 | 58641 | -1.6 | 1.6 | -1.5 |
| 26 | 2401552 | 2031924 | -1.7 | 1.7 | -1 |
| 27 | 2542603 | 1874664 | 1.7 | 1.7 | 1.5 |
| 28 | 2712347 | 1750745 | 6.1 | 6.1 | 1.5 |
| 29 | 2838022 | 1114960 | 4.3 | 4.3 | 1.5 |
| 30 | 2859227 | 2950094 | -1.4 | 1.4 | -1.4 |

FIG. 12B

| rank | ID | x | y | Δs | \|Δs\| | ε'const | finalΔs | finalΔs |
|---|---|---|---|---|---|---|---|---|
| 1 | 11 | 1311962 | 876005 | 6.6 | 6.6 | 1.5 | 1.5 | 1.5 |
| 2 | 16 | 1835188 | 2515437 | -6.3 | 6.3 | -1.5 | -1.5 | -1.5 |
| 3 | 28 | 2712347 | 1750745 | 6.1 | 6.1 | 1.5 | 1.5 | 1.5 |
| 4 | 21 | 2034154 | 2479254 | 5.6 | 5.6 | 1.5 | 1.5 | 1.5 |
| 5 | 5 | 747853 | 1534567 | 4.5 | 4.5 | 1.5 | 1.5 | 1.5 |
| 6 | 20 | 1935041 | 486907 | 4.4 | 4.4 | 1.5 | 1.5 | 1.5 |
| 7 | 29 | 2838022 | 1114960 | 4.3 | 4.3 | 1.5 | 1.5 | 1.5 |
| 8 | 17 | 1868530 | 2064068 | -4.3 | 4.3 | -1.5 | -1.5 | -1.5 |
| 9 | 18 | 1884419 | 897944 | 3.9 | 3.9 | 1.5 | 1.5 | 1.5 |
| 10 | 14 | 1531764 | 2072296 | -3.4 | 3.4 | -1.5 | -1.5 | -1.5 |
| 11 | 8 | 980622 | 2305734 | 3.2 | 3.2 | 1.5 | 3.2 | 1.5 |
| 12 | 6 | 756757 | 1795413 | 2.9 | 2.9 | 1.5 | 2.9 | 1.5 |
| 13 | 19 | 1898217 | 2455815 | 2.2 | 2.2 | 1.5 | 2.2 | 1.5 |
| 14 | 12 | 1320401 | 2363968 | -2.2 | 2.2 | -1.5 | -2.2 | -1.5 |
| 15 | 23 | 2167718 | 849248 | -2.2 | 2.2 | -1.5 | -2.2 | -1.5 |
| 16 | 1 | 167844 | 590489 | 1.7 | 1.7 | 1.5 | 1.7 | 1.7 |
| 17 | 2 | 279851 | 2657472 | 1.7 | 1.7 | 1.5 | 1.7 | 1.7 |
| 18 | 3 | 417339 | 1262166 | 1.7 | 1.7 | 1.5 | 1.7 | 1.7 |
| 19 | 4 | 516784 | 1330141 | 1.7 | 1.7 | 1.5 | 1.7 | 1.7 |
| 20 | 9 | 1019791 | 1739858 | 1.7 | 1.7 | 1.5 | 1.7 | 1.7 |
| 21 | 10 | 1038876 | 2751136 | 1.7 | 1.7 | 1.5 | 1.7 | 1.7 |
| 22 | 13 | 1530778 | 2494530 | 1.7 | 1.7 | 1.5 | 1.7 | 1.7 |
| 23 | 15 | 1638711 | 1115047 | 1.7 | 1.7 | 1.5 | 1.7 | 1.7 |
| 24 | 22 | 2043484 | 1449450 | 1.7 | 1.7 | 1.5 | 1.7 | 1.7 |
| 25 | 26 | 2401552 | 2031924 | 1.7 | 1.7 | 1.5 | 1.7 | 1.7 |
| 26 | 27 | 2542603 | 1874664 | -1.7 | 1.7 | -1.5 | -1.7 | -1.7 |
| 27 | 25 | 2273922 | 58641 | -1.6 | 1.6 | -1.5 | -1.6 | -1.6 |
| 28 | 7 | 836399 | 1205747 | 1.5 | 1.5 | 1.5 | 1.5 | 1.5 |
| 29 | 24 | 2197577 | 714225 | -1.5 | 1.5 | -1.5 | -1.5 | -1.5 |
| 30 | 30 | 2859227 | 2950094 | -1.4 | 1.4 | -1.4 | -1.4 | -1.4 |

FIG. 15A

| ID | x | y | Δs | \|Δs\| | ε'const | W | Wx\|Δs\| |
|---|---|---|---|---|---|---|---|
| 1 | 167844 | 590489 | 1.7 | 1.7 | 1.5 | 1.0 | 1.7 |
| 2 | 279851 | 2657472 | 1.7 | 1.7 | 1.5 | 1.0 | 1.7 |
| 3 | 417339 | 1262166 | 1.7 | 1.7 | 1.5 | 1.0 | 1.7 |
| 4 | 516784 | 1330141 | 1.7 | 1.7 | 1.5 | 1.0 | 1.7 |
| 5 | 747853 | 1534567 | 4.5 | 4.5 | 1.5 | 1.0 | 4.5 |
| 6 | 756757 | 1795413 | 2.9 | 2.9 | 1.5 | 1.0 | 2.9 |
| 7 | 836399 | 1205747 | 1.5 | 1.5 | 1.5 | 1.0 | 1.5 |
| 8 | 980622 | 2305734 | 3.2 | 3.2 | 1.5 | 0.0 | 0.0 |
| 9 | 1019791 | 1739858 | 1.7 | 1.7 | 1.5 | 1.0 | 1.7 |
| 10 | 1038876 | 2751136 | 1.7 | 1.7 | 1.5 | 1.0 | 1.7 |
| 11 | 1311962 | 876005 | 6.6 | 6.6 | 1.5 | 1.0 | 6.6 |
| 12 | 1320401 | 2363968 | -2.2 | 2.2 | -1.5 | 1.0 | 2.2 |
| 13 | 1530778 | 2494530 | 1.7 | 1.7 | 1.5 | 1.0 | 1.7 |
| 14 | 1531764 | 2072296 | -3.4 | 3.4 | -1.5 | 1.0 | 3.4 |
| 15 | 1638711 | 1115047 | 1.7 | 1.7 | 1.5 | 1.0 | 1.7 |
| 16 | 1835188 | 2515437 | -6.3 | 6.3 | -1.5 | 1.0 | 6.3 |
| 17 | 1868530 | 2064068 | -4.3 | 4.3 | -1.5 | 1.0 | 4.3 |
| 18 | 1884419 | 897944 | 3.9 | 3.9 | 1.5 | 1.0 | 3.9 |
| 19 | 1898217 | 2455815 | 2.2 | 2.2 | 1.5 | 2.0 | 4.4 |
| 20 | 1935041 | 486907 | 4.4 | 4.4 | 1.5 | 1.0 | 4.4 |
| 21 | 2034154 | 2479254 | 5.6 | 5.6 | 1.5 | 1.5 | 8.4 |
| 22 | 2043484 | 1449450 | 1.7 | 1.7 | 1.5 | 1.0 | 1.7 |
| 23 | 2167718 | 849248 | -2.2 | 2.2 | -1.5 | 1.0 | 2.2 |
| 24 | 2197577 | 714225 | -1.5 | 1.5 | -1.5 | 1.0 | 1.5 |
| 25 | 2273922 | 58641 | -1.6 | 1.6 | -1.5 | 1.0 | 1.6 |
| 26 | 2401552 | 2031924 | -1.7 | 1.7 | -1.5 | 1.0 | 1.7 |
| 27 | 2542603 | 1874664 | 1.7 | 1.7 | 1.5 | 1.0 | 1.7 |
| 28 | 2712347 | 1750745 | 6.1 | 6.1 | 1.5 | 1.0 | 6.1 |
| 29 | 2838022 | 1114960 | 4.3 | 4.3 | 1.5 | 1.0 | 4.3 |
| 30 | 2859227 | 2950094 | -1.4 | 1.4 | -1.4 | 1.0 | 1.4 |

FIG. 15B

| rank | ID | x | y | Δs | \|Δs\| | ε'const | W | Wx\|Δs\| | final Δs |
|---|---|---|---|---|---|---|---|---|---|
| 1 | 21 | 2034154 | 2479254 | 5.6 | 5.6 | 1.5 | 1.5 | 8.4 | 1.5 |
| 2 | 11 | 1311962 | 876005 | 6.6 | 6.6 | 1.5 | 1.0 | 6.6 | 1.5 |
| 3 | 16 | 1835188 | 2515437 | -6.3 | 6.3 | -1.5 | 1.0 | 6.3 | -1.5 |
| 4 | 28 | 2712347 | 1750745 | 6.1 | 6.1 | 1.5 | 1.0 | 6.1 | 1.5 |
| 5 | 5 | 747853 | 1534567 | 4.5 | 4.5 | 1.5 | 1.0 | 4.5 | 1.5 |
| 6 | 19 | 1898217 | 2455815 | 2.2 | 2.2 | 1.5 | 2.0 | 4.4 | 1.5 |
| 7 | 20 | 1935041 | 486907 | 4.4 | 4.4 | 1.5 | 1.0 | 4.4 | 1.5 |
| 8 | 29 | 2838022 | 1114960 | 4.3 | 4.3 | 1.5 | 1.0 | 4.3 | 1.5 |
| 9 | 17 | 1868530 | 2064068 | -4.3 | 4.3 | -1.5 | 1.0 | 4.3 | -1.5 |
| 10 | 18 | 1884419 | 897944 | 3.9 | 3.9 | 1.5 | 1.0 | 3.9 | 1.5 |
| 11 | 14 | 1531764 | 2072296 | -3.4 | 3.4 | -1.5 | 1.0 | 3.4 | -3.4 |
| 12 | 6 | 756757 | 1795413 | 2.9 | 2.9 | 1.5 | 1.0 | 2.9 | 2.9 |
| 13 | 12 | 1320401 | 2363968 | -2.2 | 2.2 | -1.5 | 1.0 | 2.2 | -2.2 |
| 14 | 23 | 2167718 | 849248 | -2.2 | 2.2 | -1.5 | 1.0 | 2.2 | -2.2 |
| 15 | 1 | 167844 | 590489 | 1.7 | 1.7 | 1.5 | 1.0 | 1.7 | 1.7 |
| 16 | 2 | 279851 | 2657472 | 1.7 | 1.7 | 1.5 | 1.0 | 1.7 | 1.7 |
| 17 | 3 | 417339 | 1262166 | 1.7 | 1.7 | 1.5 | 1.0 | 1.7 | 1.7 |
| 18 | 4 | 516784 | 1330141 | 1.7 | 1.7 | 1.5 | 1.0 | 1.7 | 1.7 |
| 19 | 9 | 1019791 | 1739858 | 1.7 | 1.7 | 1.5 | 1.0 | 1.7 | 1.7 |
| 20 | 10 | 1038876 | 2751136 | 1.7 | 1.7 | 1.5 | 1.0 | 1.7 | 1.7 |
| 21 | 13 | 1530778 | 2494530 | 1.7 | 1.7 | 1.5 | 1.0 | 1.7 | 1.7 |
| 22 | 15 | 1638711 | 1115047 | 1.7 | 1.7 | 1.5 | 1.0 | 1.7 | 1.7 |
| 23 | 22 | 2043484 | 1449450 | 1.7 | 1.7 | 1.5 | 1.0 | 1.7 | 1.7 |
| 24 | 26 | 2401552 | 2031924 | -1.7 | 1.7 | -1.5 | 1.0 | 1.7 | -1.7 |
| 25 | 27 | 2542603 | 1874664 | 1.7 | 1.7 | 1.5 | 1.0 | 1.7 | 1.7 |
| 26 | 25 | 2273922 | 58641 | -1.6 | 1.6 | -1.5 | 1.0 | 1.6 | -1.6 |
| 27 | 7 | 836399 | 1205747 | 1.5 | 1.5 | 1.5 | 1.0 | 1.5 | 1.5 |
| 28 | 24 | 2197577 | 714225 | -1.5 | 1.5 | -1.5 | 1.0 | 1.5 | -1.5 |
| 29 | 30 | 2859227 | 2950094 | -1.4 | 1.4 | -1.4 | 1.0 | 1.4 | -1.4 |
| 30 | 8 | 980622 | 2305734 | 3.2 | 3.2 | 1.5 | 0.0 | 0.0 | 3.2 |

FIG. 17A

| ID | x | y | Δs | |Δs| | ε'accu | |Δs|−ε'accu |
|---|---|---|---|---|---|---|
| 1 | 167844 | 590489 | 1.7 | 1.7 | 0.6 | 1.1 |
| 2 | 279851 | 2657472 | 1.7 | 1.7 | 0.8 | 0.9 |
| 3 | 417339 | 1262166 | 1.7 | 1.7 | 0.8 | 0.9 |
| 4 | 516784 | 1330141 | 1.7 | 1.7 | 0.6 | 1.1 |
| 5 | 747853 | 1534567 | 4.5 | 4.5 | 4.3 | 0.2 |
| 6 | 756757 | 1795413 | 2.9 | 2.9 | 0.8 | 2.1 |
| 7 | 836399 | 1205747 | 1.5 | 1.5 | 1.2 | 0.3 |
| 8 | 980622 | 2305734 | 3.2 | 3.2 | 0.8 | 2.4 |
| 9 | 1019791 | 1739858 | 1.7 | 1.7 | 0.8 | 0.9 |
| 10 | 1038876 | 2751136 | 1.7 | 1.7 | 0.8 | 0.9 |
| 11 | 1311962 | 876005 | 6.6 | 6.6 | 1.4 | 5.2 |
| 12 | 1320401 | 2363968 | −2.2 | 2.2 | −1.0 | 1.2 |
| 13 | 1530778 | 2494530 | 1.7 | 1.7 | 0.6 | 1.1 |
| 14 | 1531764 | 2072296 | −3.4 | 3.4 | −0.6 | 2.8 |
| 15 | 1638711 | 1115047 | 1.7 | 1.7 | 0.6 | 1.1 |
| 16 | 1835188 | 2515437 | −6.3 | 6.3 | −0.4 | 5.9 |
| 17 | 1868530 | 2064068 | −4.3 | 4.3 | −0.6 | 3.7 |
| 18 | 1884419 | 897944 | 3.9 | 3.9 | 0.4 | 3.5 |
| 19 | 1898217 | 2455815 | 2.2 | 2.2 | 0.8 | 1.4 |
| 20 | 1935041 | 486907 | 4.4 | 4.4 | 0.6 | 3.8 |
| 21 | 2034154 | 2479254 | 5.6 | 5.6 | 0.8 | 4.8 |
| 22 | 2043484 | 1449450 | 1.7 | 1.7 | 0.8 | 0.9 |
| 23 | 2167718 | 849248 | −2.2 | 2.2 | −1.0 | 1.2 |
| 24 | 2197577 | 714225 | −1.5 | 1.5 | −1.5 | 0.0 |
| 25 | 2273922 | 58641 | −1.6 | 1.6 | −0.9 | 0.7 |
| 26 | 2401552 | 2031924 | −1.7 | 1.7 | −1.3 | 0.4 |
| 27 | 2542603 | 1874664 | 1.7 | 1.7 | 0.8 | 0.9 |
| 28 | 2712347 | 1750745 | 6.1 | 6.1 | 6.1 | 0.0 |
| 29 | 2838022 | 1114960 | 4.3 | 4.3 | 0.8 | 3.5 |
| 30 | 2859227 | 2950094 | −1.4 | 1.4 | −1.2 | 0.2 |

FIG. 17B

| rank | ID | x | y | Δs | |Δs| | ε'accu | |Δs|−ε'accu | finalΔs |
|---|---|---|---|---|---|---|---|---|
| 1 | 16 | 1835188 | 2515437 | −6.3 | 6.3 | −0.4 | 5.9 | −0.4 |
| 2 | 11 | 1311962 | 876005 | 6.6 | 6.6 | 1.4 | 5.2 | 1.4 |
| 3 | 21 | 2034154 | 2479254 | 5.6 | 5.6 | 0.8 | 4.8 | 0.8 |
| 4 | 20 | 1935041 | 486907 | 4.4 | 4.4 | 0.6 | 3.8 | 0.6 |
| 5 | 17 | 1868530 | 2064068 | −4.3 | 4.3 | −0.6 | 3.7 | −0.6 |
| 6 | 18 | 1884419 | 897944 | 3.9 | 3.9 | 0.4 | 3.5 | 0.4 |
| 7 | 29 | 2838022 | 1114960 | 4.3 | 4.3 | 0.8 | 3.5 | 0.8 |
| 8 | 14 | 1531764 | 2072296 | −3.4 | 3.4 | −0.6 | 2.8 | −0.6 |
| 9 | 8 | 980622 | 2305734 | 3.2 | 3.2 | 0.8 | 2.4 | 0.8 |
| 10 | 6 | 756757 | 1795413 | 2.9 | 2.9 | 0.8 | 2.1 | 0.8 |
| 11 | 19 | 1898217 | 2455815 | 2.2 | 2.2 | 0.8 | 1.4 | 0.8 |
| 12 | 12 | 1320401 | 2363968 | −2.2 | 2.2 | −1.0 | 1.2 | −1.0 |
| 13 | 23 | 2167718 | 849248 | −2.2 | 2.2 | −1.0 | 1.2 | −1.0 |
| 14 | 1 | 167844 | 590489 | 1.7 | 1.7 | 0.6 | 1.1 | 0.6 |
| 15 | 4 | 516784 | 1330141 | 1.7 | 1.7 | 0.6 | 1.1 | 0.6 |
| 16 | 13 | 1530778 | 2494530 | 1.7 | 1.7 | 0.6 | 1.1 | 0.6 |
| 17 | 15 | 1638711 | 1115047 | 1.7 | 1.7 | 0.6 | 1.1 | 0.6 |
| 18 | 2 | 279851 | 2657472 | 1.7 | 1.7 | 0.8 | 0.9 | 1.7 |
| 19 | 3 | 417339 | 1262166 | 1.7 | 1.7 | 0.8 | 0.9 | 1.7 |
| 20 | 9 | 1019791 | 1739858 | 1.7 | 1.7 | 0.8 | 0.9 | 1.7 |
| 21 | 10 | 1038876 | 2751136 | 1.7 | 1.7 | 0.8 | 0.9 | 1.7 |
| 22 | 22 | 2043484 | 1449450 | 1.7 | 1.7 | 0.8 | 0.9 | 1.7 |
| 23 | 27 | 2542603 | 1874664 | 1.7 | 1.7 | 0.8 | 0.9 | 1.7 |
| 24 | 25 | 2273922 | 58641 | −1.6 | 1.6 | −0.9 | 0.7 | −1.6 |
| 25 | 26 | 2401552 | 2031924 | −1.7 | 1.7 | −1.3 | 0.4 | −1.7 |
| 26 | 7 | 836399 | 1205747 | 1.5 | 1.5 | 1.2 | 0.3 | 1.5 |
| 27 | 30 | 2859227 | 2950094 | −1.4 | 1.4 | −1.2 | 0.2 | −1.4 |
| 28 | 5 | 747853 | 1534567 | 4.5 | 4.5 | 4.3 | 0.2 | 4.5 |
| 29 | 24 | 2197577 | 714225 | −1.5 | 1.5 | −1.5 | 0.0 | −1.5 |
| 30 | 28 | 2712347 | 1750745 | 6.1 | 6.1 | 6.1 | 0.0 | 6.1 |

FIG. 17C

| rank | ID | x | y | Δs | |Δs| | ε'accu | finalΔs |
|---|---|---|---|---|---|---|---|
| 1 | 1 | 167844 | 590489 | 1.7 | 1.7 | 0.6 | 0.6 |
| 2 | 2 | 279851 | 2657472 | 1.7 | 1.7 | 0.8 | 0.8 |
| 3 | 3 | 417339 | 1262166 | 1.7 | 1.7 | 0.8 | 0.8 |
| 4 | 4 | 516784 | 1330141 | 1.7 | 1.7 | 0.6 | 0.6 |
| 5 | 5 | 747853 | 1534567 | 4.5 | 4.5 | 4.3 | 4.3 |
| 6 | 6 | 756757 | 1795413 | 2.9 | 2.9 | 0.8 | 0.8 |
| 7 | 7 | 836399 | 1205747 | 1.5 | 1.5 | 1.2 | 1.2 |
| 8 | 8 | 980622 | 2305734 | 3.2 | 3.2 | 0.8 | 0.8 |
| 9 | 9 | 1019791 | 1739858 | 1.7 | 1.7 | 0.8 | 0.8 |
| 10 | 10 | 1038876 | 2751136 | 1.7 | 1.7 | 0.8 | 0.8 |
| 11 | 11 | 1311962 | 876005 | 6.6 | 6.6 | 1.4 | 1.4 |
| 12 | 12 | 1320401 | 2363968 | −2.2 | 2.2 | −1.0 | −1.0 |
| 13 | 13 | 1530778 | 2494530 | 1.7 | 1.7 | 0.6 | 0.6 |
| 14 | 14 | 1531764 | 2072296 | −3.4 | 3.4 | −0.6 | −0.6 |
| 15 | 15 | 1638711 | 1115047 | 1.7 | 1.7 | 0.6 | 0.6 |
| 16 | 16 | 1835188 | 2515437 | −6.3 | 6.3 | −0.4 | −0.4 |
| 17 | 17 | 1868530 | 2064068 | −4.3 | 4.3 | −0.6 | −0.6 |
| 18 | 18 | 1884419 | 897944 | 3.9 | 3.9 | 0.4 | 0.4 |
| 19 | 19 | 1898217 | 2455815 | 2.2 | 2.2 | 0.8 | 0.8 |
| 20 | 20 | 1935041 | 486907 | 4.4 | 4.4 | 0.6 | 0.6 |
| 21 | 21 | 2034154 | 2479254 | 5.6 | 5.6 | 0.8 | 0.8 |
| 22 | 22 | 2043484 | 1449450 | 1.7 | 1.7 | 0.8 | 0.8 |
| 23 | 23 | 2167718 | 849248 | −2.2 | 2.2 | −1.0 | −1.0 |
| 24 | 24 | 2197577 | 714225 | −1.5 | 1.5 | −1.5 | −1.0 |
| 25 | 25 | 2273922 | 58641 | −1.6 | 1.6 | −0.9 | −1.5 |
| 26 | 26 | 2401552 | 2031924 | −1.7 | 1.7 | −1.3 | −1.6 |
| 27 | 27 | 2542603 | 1874664 | 1.7 | 1.7 | 0.8 | 1.7 |
| 28 | 28 | 2712347 | 1750745 | 6.1 | 6.1 | 6.1 | 6.1 |
| 29 | 29 | 2838022 | 1114960 | 4.3 | 4.3 | 0.8 | 4.3 |
| 30 | 30 | 2859227 | 2950094 | −1.4 | 1.4 | −1.2 | −1.4 |

FIG. 20A

| ID | x | y | Δs | \|Δs\| | ε'const | Group ID | {\|Δs\|-\|ε'const\|} | sumOf Grp |
|---|---|---|---|---|---|---|---|---|
| 1 | 167844 | 590489 | 1.7 | 1.7 | 1.5 | 1 | 0.2 | 0.8 |
| 2 | 279851 | 2657472 | 1.7 | 1.7 | 1.5 | 2 | 0.2 | 1.2 |
| 3 | 417339 | 1262166 | 1.7 | 1.7 | 1.5 | 2 | 0.2 | 1.2 |
| 4 | 516784 | 1330141 | 1.7 | 1.7 | 1.5 | 1 | 0.2 | 0.8 |
| 5 | 747853 | 1534567 | 4.5 | 4.5 | 1.5 | 3 | 3.0 | 3.0 |
| 6 | 756757 | 1795413 | 2.9 | 2.9 | 1.5 | 4 | 1.4 | 1.4 |
| 7 | 836399 | 1205747 | 1.5 | 1.5 | 1.5 | 5 | 0.0 | 0.0 |
| 8 | 980622 | 2305734 | 3.2 | 3.2 | 1.5 | 6 | 1.7 | 1.7 |
| 9 | 1019791 | 1739858 | 1.7 | 1.7 | 1.5 | 2 | 0.2 | 1.2 |
| 10 | 1038876 | 2751136 | 1.7 | 1.7 | 1.5 | 2 | 0.2 | 1.2 |
| 11 | 1311962 | 876005 | 6.6 | 6.6 | 1.5 | 7 | 5.1 | 5.1 |
| 12 | 1320401 | 2363968 | -2.2 | 2.2 | -1.5 | 8 | 0.7 | 1.4 |
| 13 | 1530778 | 2494530 | 1.7 | 1.7 | 1.5 | 1 | 0.2 | 0.8 |
| 14 | 1531764 | 2072296 | -3.4 | 3.4 | -1.5 | 9 | 1.9 | 1.9 |
| 15 | 1638711 | 1115047 | 1.7 | 1.7 | 1.5 | 1 | 0.2 | 0.8 |
| 16 | 1835188 | 2515437 | -6.3 | 6.3 | -1.5 | 10 | 4.8 | 4.8 |
| 17 | 1868530 | 2064068 | -4.3 | 4.3 | -1.5 | 11 | 2.8 | 2.8 |
| 18 | 1884419 | 897944 | 3.9 | 3.9 | 1.5 | 12 | 2.4 | 2.4 |
| 19 | 1898217 | 2455815 | 2.2 | 2.2 | 1.5 | 13 | 0.7 | 0.7 |
| 20 | 1935041 | 486907 | 4.4 | 4.4 | 1.5 | 14 | 2.9 | 2.9 |
| 21 | 2034154 | 2479254 | 5.6 | 5.6 | 1.5 | 15 | 4.1 | 4.1 |
| 22 | 2043484 | 1449450 | 1.7 | 1.7 | 1.5 | 2 | 0.2 | 1.2 |
| 23 | 2167718 | 849248 | -2.2 | 2.2 | -1.5 | 8 | 0.7 | 1.4 |
| 24 | 2197577 | 714225 | -1.5 | 1.5 | -1.5 | 16 | 0.0 | 0.0 |
| 25 | 2273922 | 58641 | -1.6 | 1.6 | -1.5 | 17 | 0.1 | 0.1 |
| 26 | 2401552 | 2031924 | -1.7 | 1.7 | -1.5 | 18 | 0.2 | 0.2 |
| 27 | 2542603 | 1874664 | 1.7 | 1.7 | 1.5 | 2 | 0.2 | 1.2 |
| 28 | 2712347 | 1750745 | 6.1 | 6.1 | 1.5 | 19 | 4.6 | 4.6 |
| 29 | 2838022 | 1114960 | 4.3 | 4.3 | 1.5 | 20 | 2.8 | 2.8 |
| 30 | 2859227 | 2950094 | -1.4 | 1.4 | -1.4 | 21 | 0.0 | 0.0 |

FIG. 20B

| rank | ID | x | y | Δs | \|Δs\| | ε'const | Group ID | {\|Δs\|-\|ε'const\|} | sumOf Grp | finalΔs | finalΔs |
|---|---|---|---|---|---|---|---|---|---|---|---|
| 1 | 11 | 1311962 | 876005 | 6.6 | 6.6 | 1.5 | 7 | 5.1 | 5.1 | 1.5 | 1.5 |
| 2 | 16 | 1835188 | 2515437 | -6.3 | 6.3 | -1.5 | 10 | 4.8 | 4.8 | -1.5 | -1.5 |
| 3 | 28 | 2712347 | 1750745 | 6.1 | 6.1 | 1.5 | 19 | 4.6 | 4.6 | 1.5 | 1.5 |
| 4 | 21 | 2034154 | 2479254 | 5.6 | 5.6 | 1.5 | 15 | 4.1 | 4.1 | 1.5 | 1.5 |
| 5 | 5 | 747853 | 1534567 | 4.5 | 4.5 | 1.5 | 3 | 3.0 | 3.0 | 1.5 | 1.5 |
| 6 | 20 | 1935041 | 486907 | 4.4 | 4.4 | 1.5 | 14 | 2.9 | 2.9 | 1.5 | 1.5 |
| 7 | 29 | 2838022 | 1114960 | 4.3 | 4.3 | 1.5 | 20 | 2.8 | 2.8 | 1.5 | 1.5 |
| 8 | 17 | 1868530 | 2064068 | -4.3 | 4.3 | -1.5 | 11 | 2.8 | 2.8 | -1.5 | -1.5 |
| 9 | 18 | 1884419 | 897944 | 3.9 | 3.9 | 1.5 | 12 | 2.4 | 2.4 | 1.5 | 1.5 |
| 10 | 14 | 1531764 | 2072296 | -3.4 | 3.4 | -1.5 | 9 | 1.9 | 1.9 | -1.5 | -1.5 |
| 11 | 8 | 980622 | 2305734 | 3.2 | 3.2 | 1.5 | 6 | 1.7 | 1.7 | 3.2 | 1.5 |
| 12 | 12 | 1320401 | 2363968 | -2.2 | 2.2 | -1.5 | 8 | 0.7 | 1.4 | -2.2 | -1.5 |
| 13 | 23 | 2167718 | 849248 | -2.2 | 2.2 | -1.5 | 8 | 0.7 | 1.4 | -2.2 | -1.5 |
| 14 | 6 | 756757 | 1795413 | 2.9 | 2.9 | 1.5 | 4 | 1.4 | 1.4 | 2.9 | 1.5 |
| 15 | 2 | 279851 | 2657472 | 1.6 | 1.6 | 1.5 | 2 | 0.2 | 1.2 | 1.6 | 1.5 |
| 16 | 3 | 417339 | 1262166 | 1.6 | 1.6 | 1.5 | 2 | 0.2 | 1.2 | 1.6 | 1.5 |
| 17 | 9 | 1019791 | 1739858 | 1.6 | 1.6 | 1.5 | 2 | 0.2 | 1.2 | 1.6 | 1.5 |
| 18 | 10 | 1038876 | 2751136 | 1.6 | 1.6 | 1.5 | 2 | 0.2 | 1.2 | 1.6 | 1.5 |
| 19 | 22 | 2043484 | 1449450 | 1.6 | 1.6 | 1.5 | 2 | 0.2 | 1.2 | 1.6 | 1.5 |
| 20 | 27 | 2542603 | 1874664 | 1.6 | 1.6 | 1.5 | 2 | 0.2 | 1.2 | 1.6 | 1.5 |
| 21 | 1 | 167844 | 590489 | 1.7 | 1.7 | 1.5 | 1 | 0.2 | 0.8 | 1.7 | 1.5 |
| 22 | 4 | 516784 | 1330141 | 1.7 | 1.7 | 1.5 | 1 | 0.2 | 0.8 | 1.7 | 1.5 |
| 23 | 13 | 1530778 | 2494530 | 1.7 | 1.7 | 1.5 | 1 | 0.2 | 0.8 | 1.7 | 1.5 |
| 24 | 15 | 1638711 | 1115047 | 1.7 | 1.7 | 1.5 | 1 | 0.2 | 0.8 | 1.7 | 1.5 |
| 25 | 19 | 1898217 | 2455815 | 2.2 | 2.2 | 1.5 | 13 | 0.7 | 0.7 | 2.2 | 2.2 |
| 26 | 26 | 2401552 | 2031924 | -1.7 | 1.7 | -1.5 | 18 | 0.2 | 0.2 | -1.7 | -1.7 |
| 27 | 25 | 2273922 | 58641 | -1.6 | 1.6 | -1.5 | 17 | 0.1 | 0.1 | -1.6 | -1.6 |
| 28 | 7 | 836399 | 1205747 | 1.5 | 1.5 | 1.5 | 5 | 0.0 | 0.0 | 1.5 | 1.5 |
| 29 | 24 | 2197577 | 714225 | -1.5 | 1.5 | -1.5 | 16 | 0.0 | 0.0 | -1.5 | -1.5 |
| 30 | 30 | 2859227 | 2950094 | -1.4 | 1.4 | -1.4 | 21 | 0.0 | 0.0 | -1.4 | -1.4 |

LITHOGRAPHY VERIFICATION APPARATUS AND LITHOGRAPHY SIMULATION PROGRAM

CROSS-REFERENCE TO RELATED APPLICATIONS

The disclosure of Japanese Patent Application No. 2011-15377 filed on Jan. 27, 2011 including the specification, drawings and abstract is incorporated herein by reference in its entirety.

BACKGROUND

The present invention relates to a lithography verification apparatus suitable for a model of a semiconductor integrated circuit.

A lithography process has been known as a general semiconductor manufacturing technology. This lithography process optically transfers a predetermined mask pattern to a wafer using an exposure device.

With a recent demand for miniaturization, mask patterns have been fabricated in consideration of an optical proximity correction (OPC and hereinafter also called "OPC") and resolution enhancement techniques (RET). That is, in the process of circuit layout design and OPC development, it is determined whether errors (typically an excess of an error standard value, etc.) expected to be problematic in manufacture, based on simulation exist in a desired circuit layout, or an improved one of the original circuit layout shape, or each mask pattern obtained as a result of further execution of the OPC or the like thereon. A technique called lithography verification has been put into practical use as one for verifying and determining whether a problem occurs in any position (coordinates X and y) of such mask patterns (refer to Patent Documents 1 and 2).

As for the lithography verification, various applications such as its utilization for the OPC development and design phase, so-called DFM (Design For Manufacturability), etc. are known. However, in order to enhance the degree of completion of OPC specs or an OPC tool at the OPC development, there are principally two aims: a software defect detection for detecting defects in these software, and a mask fabrication pass/fail decision for detecting an OPC result and a design layout to be problematic in terms of a device operation/yield. In particular, the mask fabrication go/no-go decision gets involved in product deadline, the operation of each product and reliability and is further important even for an estimation of development effects.

Mask patterns have been required to be corrected based on the result of the lithography verification in such a manner that a finished shape on a wafer is brought to a desired shape, i.e., a shape intended in design. In addition to this, however, there is a need to perform their corrections under various constraints such as constraints on mask fabrication, constraints on lithography process margins.

RELATED ART DOCUMENTS

Patent Documents

[Patent Document 1] Japanese Unexamined Patent Publication No. 2008-28092
[Patent Document 2] Japanese Unexamined Patent Publication No. 2010-40898

SUMMARY

Generally, when the correction is carried out under the constraints, dimensional accuracy is degraded. Verification has heretofore been performed on the degradation of the dimensional accuracy using the following two methods. As the first method, a dimensional standard at lithography verification is uniformly relaxed to perform verification in expectation of the fact that the dimensional standard will be degraded due to the correction under the constraints. As the second method, in order to prevent an excess of standard relaxation, points subject to constraints with the OPC are extracted and a dimensional standard at lithography verification is relaxed only with respect to these points, and those other than these are verified without the standard relaxation.

Although the first method is of a method easy where the points placed under the constraints are restrictive and the dimensional accuracy standard may be relaxed as a whole, the method finds difficulty in application because the standard relaxation becomes excessive with respect to progress in process miniaturization, a layout shrinkage for a reduction in chip area, an increase in the demand for securing an improvement in the reliability of a chip, a reduction in dimensional variable margin taken into consideration in the design phase, etc.

On the other hand, the second method is a method compatible to verify that the operation on software is proper, but is not compatible with the mask fabrication go/no-go decision. A problem therefore arose in that it was not able to verify the effects of degradation of dimensional accuracy due to the correction under constraints, on the operation of a device and its yield in the aggregate. A problem also arose in that it was not able to predict the effect of an improvement in accuracy due to changes in each individual design layout and OPC specs.

Upon so-called DFM, a problem arises in that it is difficult to estimate the efficiency of development at layout correction and quantitatively evaluate to which extent the effect of continuing the OPC-spec development is obtained over the entire chip with respect to such a layout pattern as not to be finished as expected in value physically by definition as in the case of a gate pattern near an active end.

The present invention has been made to solve the foregoing problems. It is an object of the present invention to provide a lithography verification apparatus and a lithography simulation program which execute high-precision lithography verification in consideration of the effects of individual errors integrated.

A lithography verification apparatus according to one embodiment of the present invention includes a simulation execution unit which predicts a status value corresponding to a difference between a specification value of each of a plurality of layout patterns and a finished dimension thereof, based on layout data about the layout patterns to be formed over a wafer and a simulation condition including simulation parameters, and a determination unit which calculates a variation distribution of the status values of the layout patterns, which are calculated by the simulation execution unit, and determines a simulation result, based on the variation distribution.

According to the one embodiment of the present invention, the simulation result is determined based on the variation distribution of the status values about the layout patterns formed over the wafer, which have been calculated by the simulation execution unit. It is thus possible to execute high-precision lithography verification in consideration of the effects of individual errors integrated.

BRIEF DESCRIPTION OF THE DRAWINGS

FIG. 5 is a diagram for describing an error list according to the first embodiment of the present invention;

FIGS. 12(A) and 12(B) are respectively diagrams for describing updating of each error list according to the second embodiment of the present invention;

FIGS. 15(A) and 15(B) are respectively diagrams for describing updating of each error list according to the third embodiment of the present invention;

FIGS. 17(A), 17(B) and 17(C) are respectively diagrams for describing updating of each error list according to the fourth embodiment of the present invention;

FIGS. 20(A) and 20(B) are respectively diagrams for describing updating of each error list according to the fifth embodiment of the present invention;

DETAILED DESCRIPTION

Figure 1:
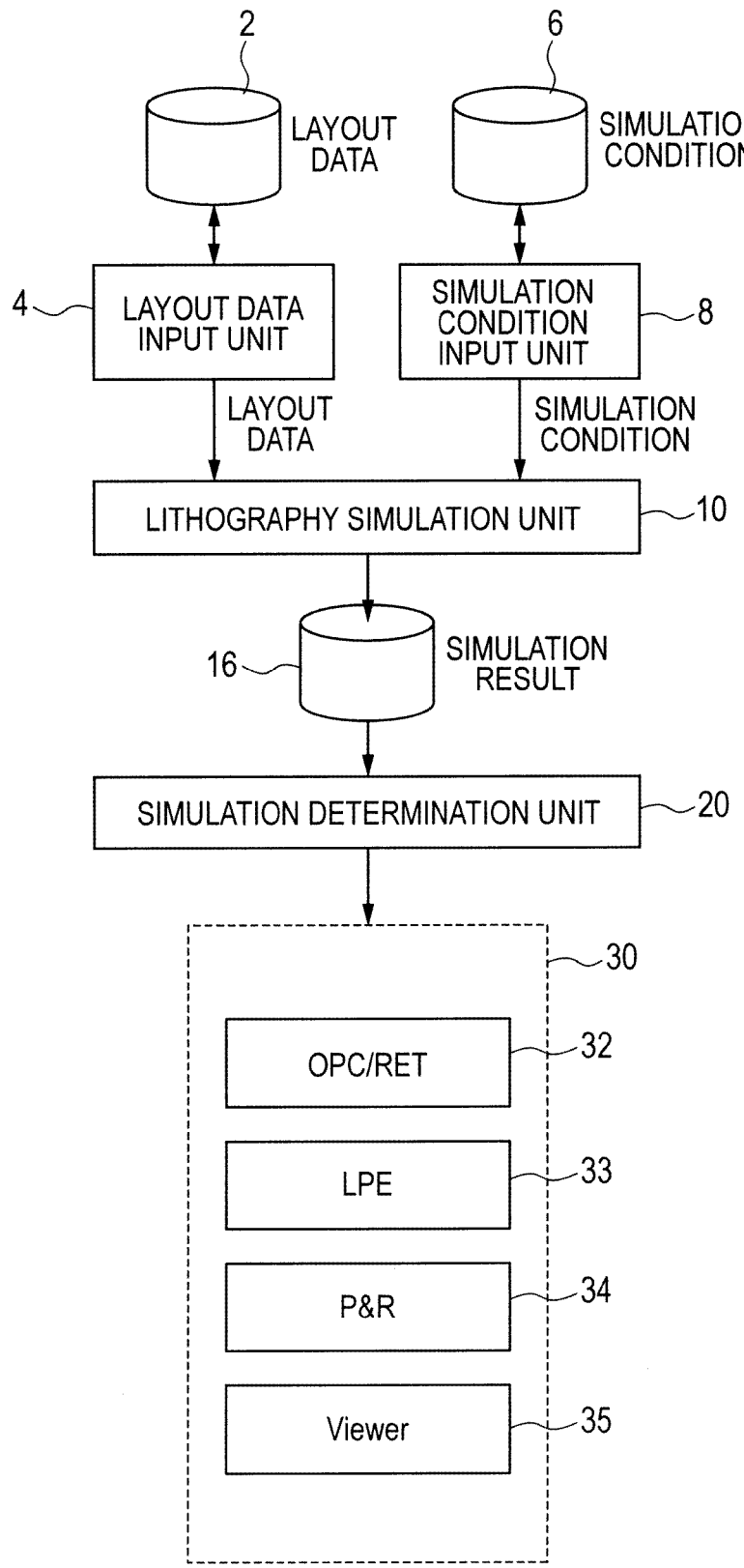
FIG. 1 is a functional block diagram of a lithography verification apparatus according to a first embodiment of the present invention.

Preferred embodiments of the present invention will be described in detail with reference to the accompanying drawings. Incidentally, the same reference numerals are respectively attached to the same or corresponding components in the accompanying drawings, and their description will not be repeated.

First Embodiment

FIG. 1 is a functional block diagram of a lithography verification apparatus according to a first embodiment of the present invention.

Referring to FIG. 1, the lithography verification apparatus according to the first embodiment of the present invention includes a layout data storage unit 2, a layout data input unit 4, a simulation condition storage unit 6, a simulation condition input unit 8, a lithography simulation unit 10, a simulation result storage unit 16, a simulation determination unit 20 and an application unit 30.

The layout data storage unit 2 stores therein a plurality of layout data groups used as simulation's inputs. Layout data are data related to a plurality of layout patterns to be formed over a wafer, e.g., data for defining the shapes of the patterns. More specifically, the layout data may be data about mask patterns of photomasks used at exposure in order to form the patterns. Attribute information about layer numbers, properties and the like of the layout data are also contained therein. These circuit layout data are inputted in advance separately for a semiconductor device and the like targeted for production.

The layout data input unit 4 extracts the necessary data out of the layout data or the like stored in the layout data storage unit 2 and inputs the same to the lithography simulation unit 10.

The simulation condition storage unit 6 stores therein simulation conditions necessary for simulation, such as a simulation model referred to when simulation is done, allocation of the layout data within the simulation, process parameters such as optical characteristics and resist characteristics of an exposure device, etc. Data about these simulation conditions are inputted separately in advance for exposure equipment, production lines and the like used in manufacture.

The simulation condition input unit 8 extracts the necessary one out of the simulation conditions or the like stored in the simulation condition storage unit 6 and inputs the same to the lithography simulation unit 10.

The lithography simulation unit 10 performs lithography simulation using the layout data inputted from the layout data input unit 4 and the simulation condition inputted from the simulation condition input unit 8. More specifically, the lithography simulation unit 10 performs physical simulation for predicting effects on shapes on a wafer and the characteristics of each device, which are related to manufacturing conditions such as an optical effect, a resist effect, an etching effect, a charged beam effect, CMP (Chemical Mechanical Planarization), etc., which are simulation conditions with respect to layout patterns formed based on the layout data.

The simulation result storage unit 16 stores therein a result of execution by the lithography simulation unit 10.

The simulation determination unit 20 determines a simulation result, based on the result of execution by the lithography simulation unit 10.

The application unit 30 includes various applications using the result of determination by the simulation determination unit 20. More concretely, the application unit 30 includes an OPC (Optical Proximity Correction)/RET (Resolution Enhancement Techniques) 32, an LPE (Layout Parameter Extraction) 33, a P&R (Place and Route) 34, a Viewer 35 (visual inspection of simulation result), etc.

Layouts, OPC/RET, etc. are corrected using a tool of the application unit 30 based on the simulation result. This is repeated.

Figure 2:
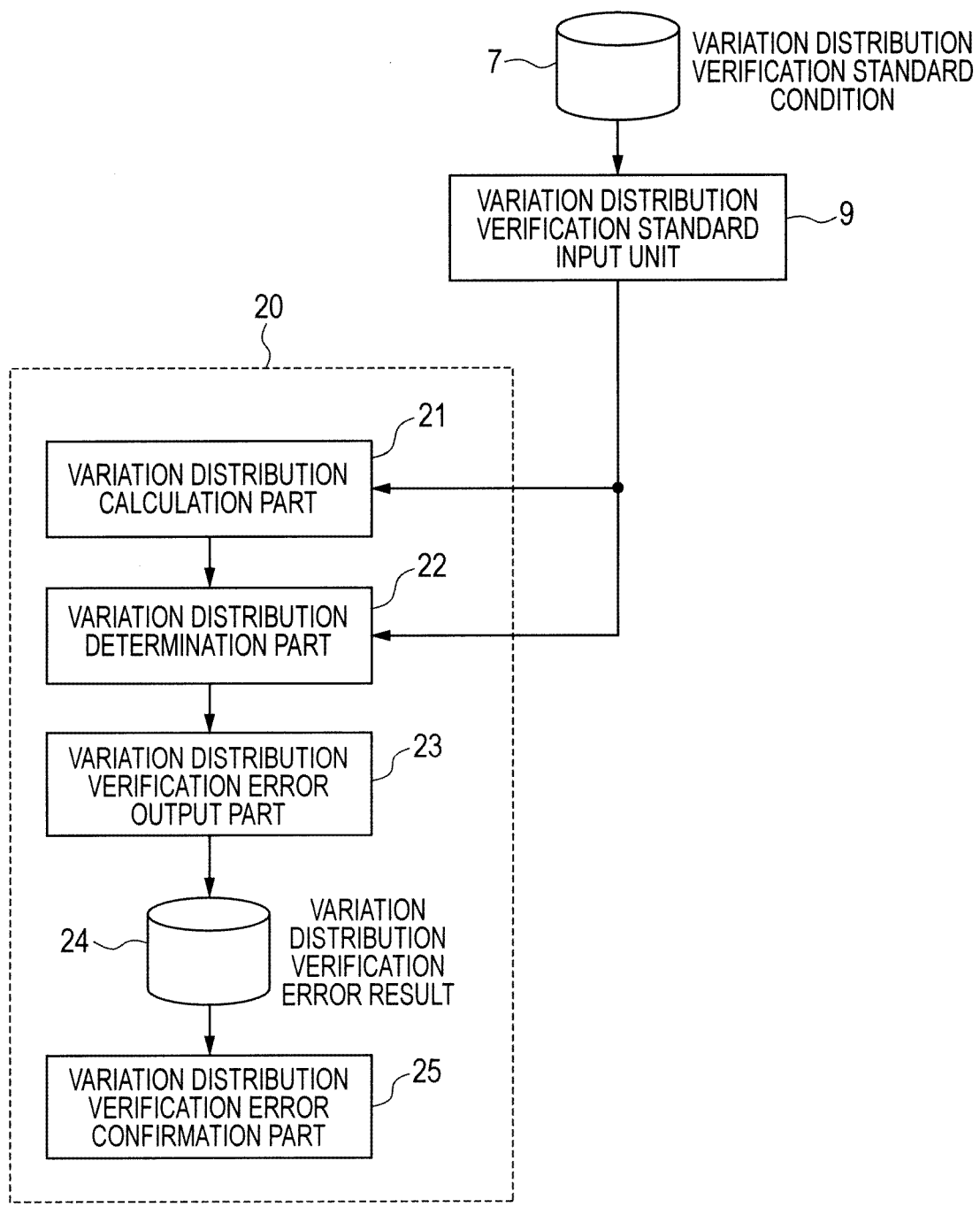
FIG. 2 is a diagram for describing the function of a simulation determination unit 20 according to the first embodiment of the present invention.

FIG. 2 is a diagram for describing the function of the simulation determination unit 20 according to the first embodiment of the present invention.

Referring to FIG. 2, the simulation determination unit 20 includes a variation distribution calculation part 21, a variation distribution determination part 22, a variation distribution verification error output part 23, a variation distribution verification error result storage part 24 and a variation distribution verification error confirmation part 25. A variation distribution verification standard condition storage unit 7 and a variation distribution verification standard input unit 9 are also provided.

The variation distribution verification standard condition storage unit 7 stores variation distribution verification standard conditions therein. The related-art verification standard is an error standard of an error at each individual simulation point, whereas as the variation distribution verification standard, an error standard with respect to statistical values such as the mean of errors, a standard deviation, a range, etc. is stored therein. Here, these statistics will be referred to as a variation distribution value D. The variation distribution value D may be these statistics or more generally a chip yield or an index indicative of a change in the chip yield.

The variation distribution verification standard input unit 9 extracts the necessary condition out of the variation distribution verification standard conditions stored in the variation distribution verification standard condition storage unit 7 and inputs the same to the variation distribution calculation part 21 and the variation distribution determination part 22. Incidentally, the present embodiment will explain where the variation distribution verification standard condition storage unit 7 and the variation distribution verification input unit 9 are provided outside the simulation determination unit 20. They may however be configured as part of the simulation determination unit 20. They are similar even to the following.

The variation distribution calculation part 21 calculates a variation distribution in view of the simulation result and the variation distribution verification standard conditions of the lithography simulation unit. Here, the variation distribution may be statistical values of the entire semiconductor chip or selected parts such as a critical path, various modules, a specific layout point, etc. which are simulation points, or may be indices indicative of, like yields, delay time, leak power or the like calculated from errors of these simulation points, yields at this part, and operational electrical characteristics.

The variation distribution determination part 22 performs a variation distribution error determination, based on the variation distribution verification standard conditions on the basis of the output of the variation distribution calculation part 21 without performing an error determination of each individual simulation point. That is, the system according to the present embodiment compares the variation distribution value D and a variation distribution error standard δ with respect to the entire semiconductor chip or the whole part taken as each simulation point to thereby determine whether the standard of a variation distribution is met, without performing the error determination every simulation point.

The variation distribution verification error output part 23 outputs each error, based on the result of determination by the variation distribution determination part 22.

The variation distribution verification error result storage part 24 stores the corresponding result of error therein. The variation distribution verification error confirmation part 25 confirms each error result stored in the variation distribution verification error result storage part 24. Concretely, the error results may be made visible and classified according to the type of verification, errors and the like, and may be displayed on a display.

Figure 3:
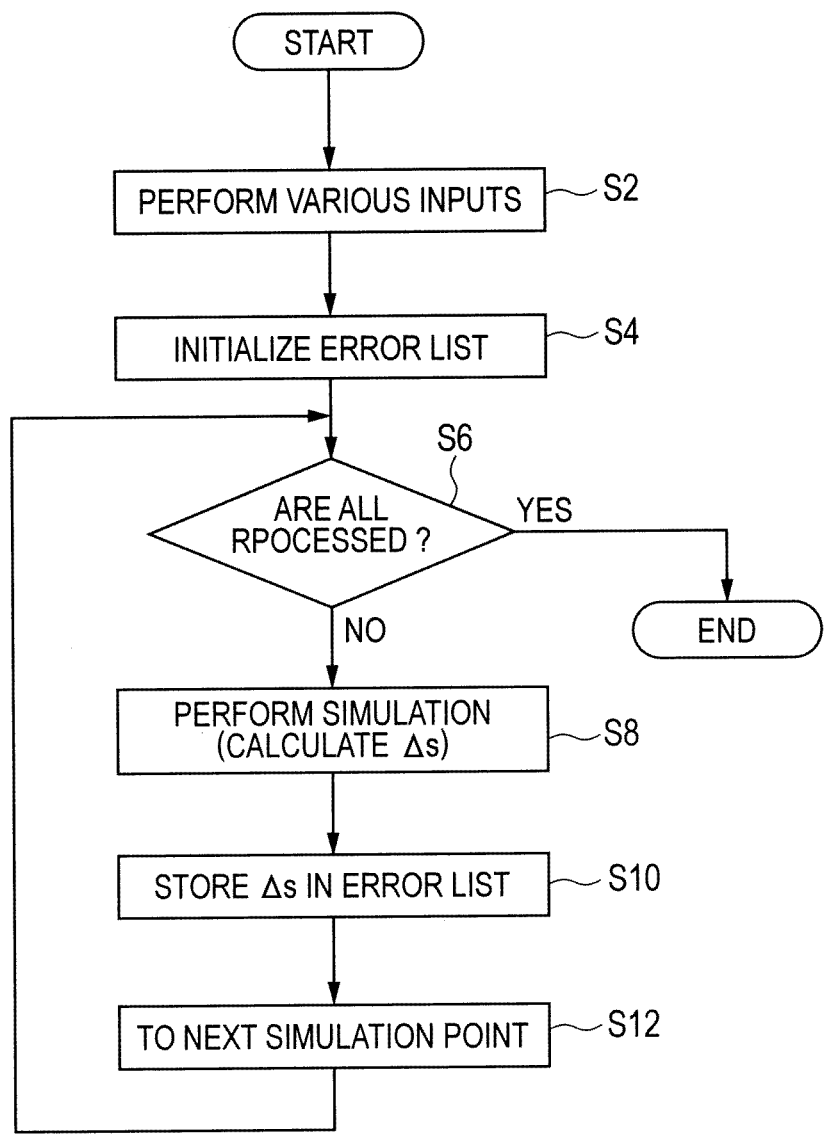
FIG. 3 is a flow chart for describing a simulation process at a lithography simulation unit 10 according to the first embodiment of the present invention.

FIG. 3 is a flow chart for describing a process of simulation at the lithography simulation unit 10 according to the first embodiment of the present invention.

Referring to FIG. 3, various information (layout data, data about simulation conditions, etc.) are first inputted (Step S2).

Next, an error list is initialized (Step S4). As the initialization of the error list, the initialization (reset) of a memory region or the like that temporarily stores a verification error therein is executed.

Next, it is determined whether all of points target for simulation are processed (Step S6).

The simulation target points are, for example, all layout patterns contained in a design layout of one layer of a semiconductor chip to be verified, or a plurality of layout patterns contained in a limited region thereof. The semiconductor chip is comprised of a plurality of wiring layers laminated over a semiconductor substrate. Each of the laminated wiring layers corresponds to one layer. As a layout pattern of one layer, may be mentioned, a pattern of polysilicon or a metal of a layer in which a gate electrode of a field effect transistor is formed, or a pattern of a metal wiring located in a layer above the pattern and composed principally of aluminum or copper.

When it is determined at Step S6 that the simulation target points have been all processed (when the answer is YES at Step S6), the processing is ended (END).

On the other hand, when it is determined that all of the simulation target points are not processed (when the answer is NO at Step S6), the processing proceeds to Step S8, where simulation is performed on the corresponding simulation target point (Step S8). Concretely, an error Δs is calculated by comparison between a simulation result and a standard with respect to a layout pattern of a certain selected one of the simulation target points. If the type of verification is related to, for example, a difference between a design layout pattern on a wafer and its finished size or dimension, then the finished dimension on the wafer is determined by simulation and the size of the design layout pattern is measured. The difference between the two is assumed to be an error Δs. The error Δs will be explained below.

Next, the error Δs is stored in its corresponding error list (Step S10). The processing proceeds to a process for the next simulation target point (Step S12). Concretely, the processing returns to Step S6.

If the processing of all the simulation target points is not ended, then an untreated layout pattern is selected and Steps S8 and S10 are executed. Thus, until simulation on all wiring patterns of the simulation target points is processed, the corresponding processing is repeated. Incidentally, the same simulation condition is used upon execution of the simulation in FIG. 3. That is, under the same manufacturing condition, respective errors Δs of all layout patterns at the simulation target points are calculated.

Figure 4:
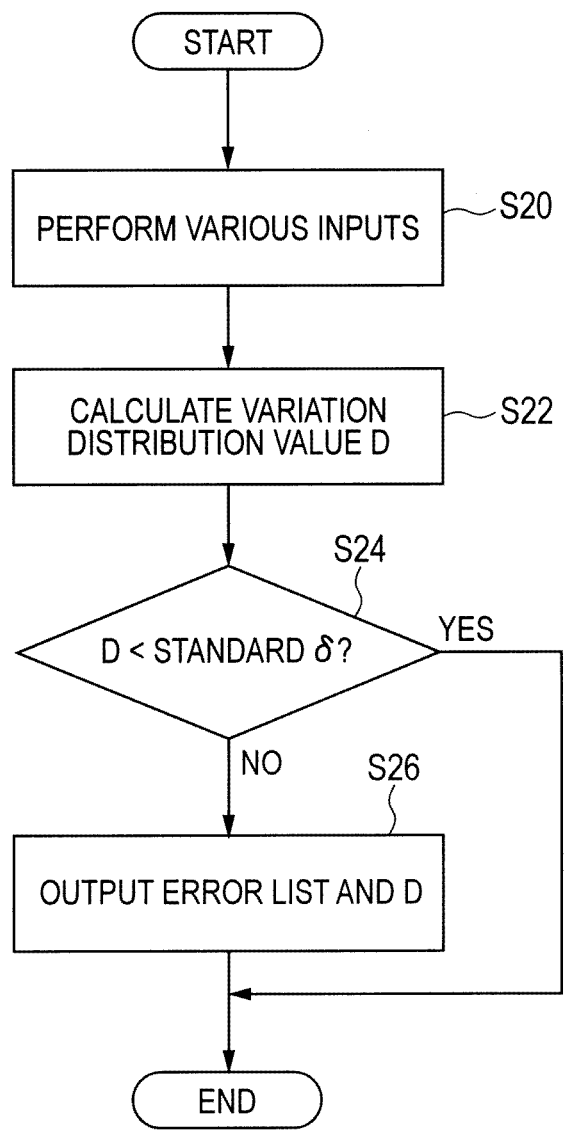
FIG. 4 is a flow chart for describing a process of the simulation determination unit 20 according to the first embodiment of the present invention.

FIG. 4 is a flow chart for describing the process of the simulation determination unit 20 according to the first embodiment of the present invention.

Referring to FIG. 4, various information (simulation results, error standard, etc.) are first inputted (Step S20).

A variation distribution value D is next calculated (Step S22). Here, the calculation of the variation distribution value D is performed on the whole of errors of all layout patterns in the simulation target points, errors of a plurality of layout patterns at pre-set points of the simulation target points, or errors produced every point assumed to be classified out of the simulation target points.

Next, the variation distribution value D and a variation distribution error standard (simply also called error standard) δ are compared with each other. It is determined whether the condition is met, i.e., it is determined whether the variation distribution value D is smaller than the error standard δ (Step S24). Here, the variation distribution error standard δ is a standard for a standard deviation of a dimensional displacement, the sum of a dimensional-displacement average value and a standard deviation, a yield value, a value related to the electrical characteristic of a chip/function block, or the like.

When it is determined at Step S24 that the variation distribution value D is smaller than the error standard δ (when the answer is YES at Step S24), it is determined that there is no error, and the processing is ended (END).

On the other hand, when it is determined at Step S24 that the variation distribution value D is not smaller than the error standard δ (when the answer is NO at Step S24), it is determined that there is an error, and an error list and a variation distribution value D are outputted (Step S26). And the processing is ended (END).

In the lithography verification according to the first embodiment of the present invention, if the variation distribution value D is within the error standard δ, the simulation result is ended as a verification pass. That is, if the variation distribution value D<error standard δ is taken as the entire circuit or the entire design layout even with respect to points corrected or modified as errors if there exists even one error in the related-art case, the processing is ended with no need to perform correction as a simulation result. Incidentally, even if the error points exist, only operation-guaranteed errors are not corrected, and the correction of each error point at which a critical error (error at which a numerical value greatly deviates from the standard) exists may be required.

When the variation distribution value does not fall within the error standard, the correction of a layout and OPC/RET specs or the like is performed and repeated. Concretely, the correction of the layout and the OPC/RET specs or the like is performed only on, for example, a point necessary to reach the variation distribution value D<error standard δ as the entire chip without correcting all of error points.

FIG. 5 is a diagram for describing an error list according to the first embodiment of the present invention. The error list according to the first embodiment of the present invention is shown referring to FIG. 5. Here, thirty error points are shown in list form as one example. The drawing shows where IDs are associated with their corresponding error points in their detected order. Here, "x, y" indicate an x coordinate and a y coordinate for a marker position of each error point as viewed from a reference point of the entire chip. Δs indicates a difference between a specification value of a design layout pattern formed over a wafer and its finished size or dimension.

Figure 6A:
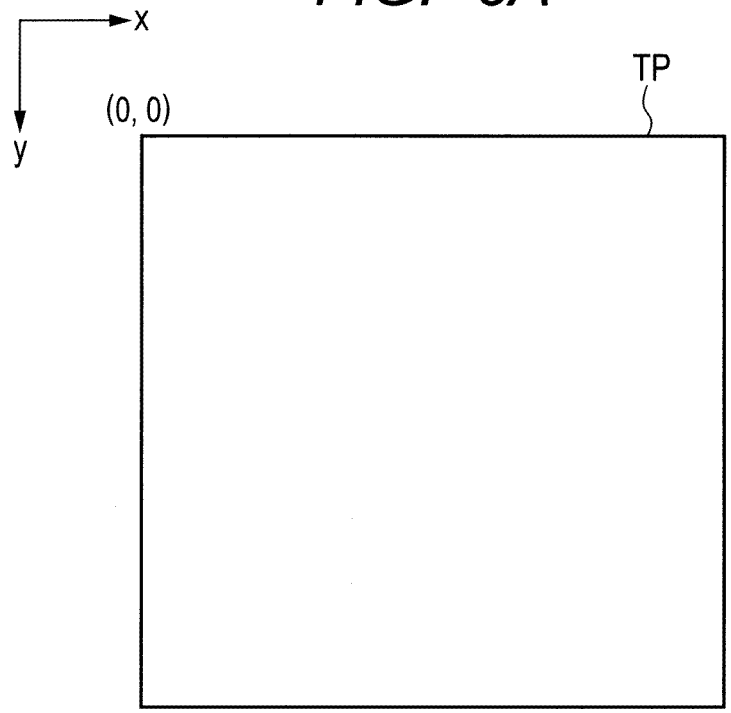
FIGS. 6(A) and 6(B) are respectively diagrams for describing an outline of a chip according to the first embodiment of the present invention.
Figure 6B:
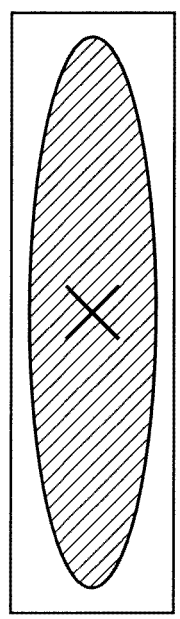

FIGS. 6(A) and 6(B) are respectively diagrams for describing the outline of a chip according to the first embodiment of the present invention. Lithography verification according to the first embodiment of the present invention is performed on the entire chip TP referring to FIG. 6(A). In the present embodiment, there is shown, as one example, where x and y coordinates are defined when the vertex at the left edge is assumed to be a reference point of (0, 0). FIG. 6(B) shows a pattern actually finished with respect to one designed layout pattern and illustrates a marker "x" of an error point. The position of the marker "x" corresponds to the x and y coordinates of the error point.

Figure 7:
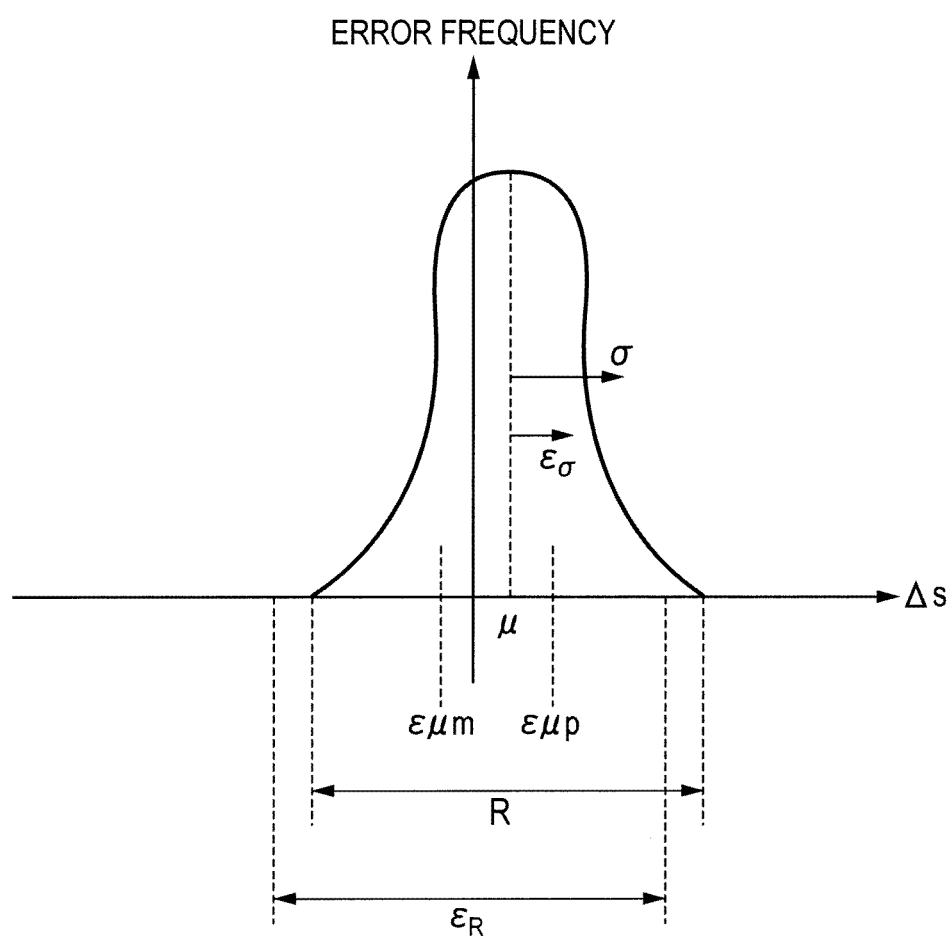
FIG. 7 is a diagram for describing a statistical distribution of an error frequency according to the first embodiment of the present invention.

FIG. 7 is a diagram for describing a statistical distribution of an error frequency according to the first embodiment of the present invention. Referring to FIG. 7, there is shown as the statistical distribution of the error frequency, where an x axis of a graph is taken as an error Δs and a y axis thereof is taken as the frequency assuming that the number of layout patterns each having the error Δs is taken as the number of errors.

μ indicates the average value of the error Δs, σ indicates a standard deviation of the error Δs, and R indicates a range of the error Δs. εμp, εμm, εσ and εR respectively indicate variation distribution error standards corresponding to these. The present drawing illustrates one example of an output. If the variation distribution value D and the variation distribution error standard ε are contained, another form may be taken. The processing may be performed manually on the basis of this display or processing of another tool may be carried out with these values as inputs.

Figure 8A:
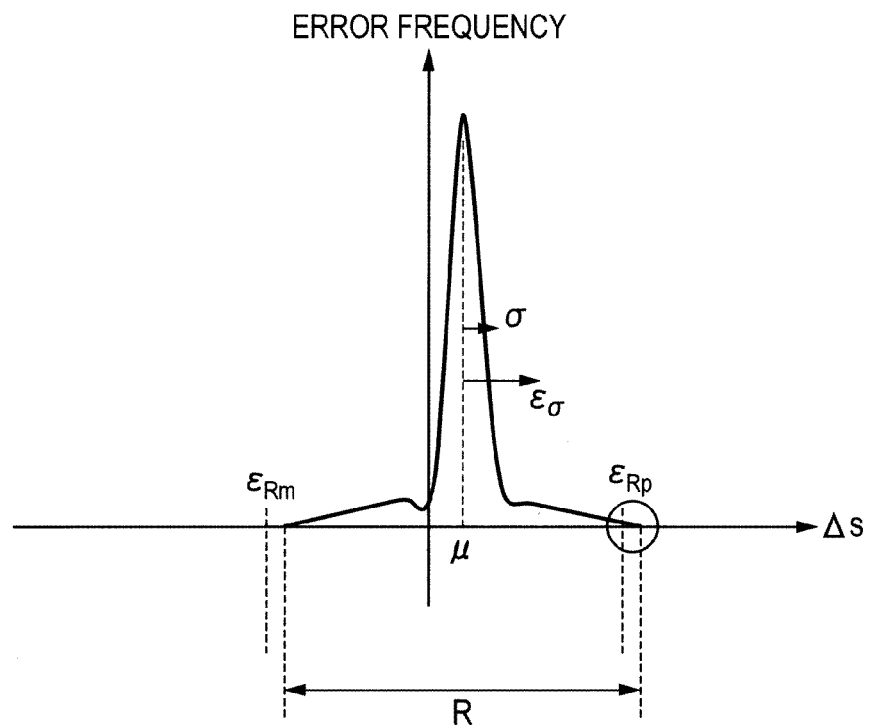
FIGS. 8(A) and 8(B) are respectively other diagrams for describing statistical distributions of error frequencies according to the first embodiment of the present invention.
Figure 8B:
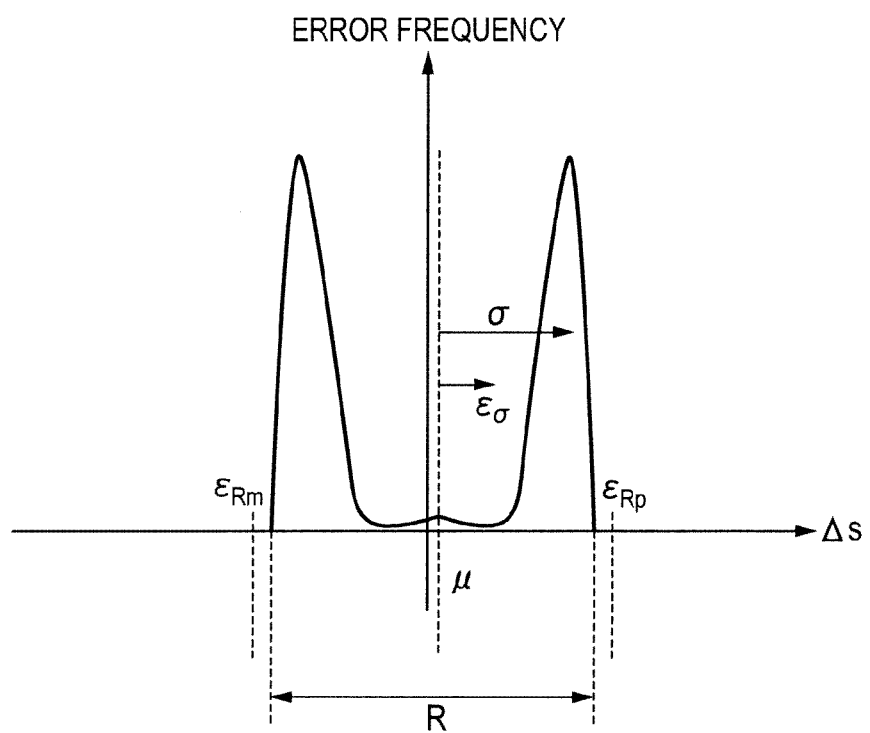

FIGS. 8(A) and 8(B) are respectively other diagrams for describing statistical distributions of error frequencies according to the first embodiment of the present invention. Referring to FIGS. 8(A) and 8(B), x and y axes of graphs and signs are similar to those in FIG. 7. In FIG. 8(A), the error Δs is assumed to be distributed in a wide range, and the range R is assumed to be in violation of the variation distribution error standard εR of the range R. Since the related-art verification determines each individual error according to the range (whether it exceeds the standard of the maximum or minimum value), a portion indicated by "○" in the drawing is detected as an error point, so that the result of verification that a verification error exists is brought about.

On the other hand, in the example of FIG. 8(B), the error Δs is distributed in a range narrower than that shown in FIG. 8(A), and the range R falls within the variation distribution error standard εR.

Thus, since a pass/fail decision of each individual error is made according to the range in the related-art verification, there is obtained a verification result that no verification error exists therein.

On the other hand, in view of a frequency distribution, FIG. 8(A) shows that the frequency concentrates on an error Δs close to the average value μ and consequently the variation distribution σ is relatively small. On the other hand, FIG. 8(B) shows that the peak of the frequency exists in each Δs away from the average value μ and consequently the variation distribution σ is large. Such an extreme frequency distribution may occur according to the OPC/RET specs or the like where a process margin is small in a leading process in particular.

The comparison between FIGS. 8(A) and 8(B) can be determined depending on the setting of εσ, but the comparison between the two could not be performed correctly in the related art method.

In the method according to the first embodiment of the present invention described above, the frequency distribution is determined from another scale of a variation as well as the range of the error Δs. For example, FIG. 8(B) in which the variation distribution σ is large can be determined to exist in verification error, and FIG. 8(A) in which the variation distribution σ is small can be determined to be free of the verification error.

The verification pass/fail can be judged by the statistical index obtained as a result of integration of the verification errors by verifying whether the variation distribution falls within the error standard value. Thus, a mask fabrication go/no-go decision and a revision necessity/non-necessity decision or the like based on a layout and OPC/RET specs can be executed highly accurately. It is also possible to make use of a development resource more efficiently.

Second Embodiment

Figure 9:
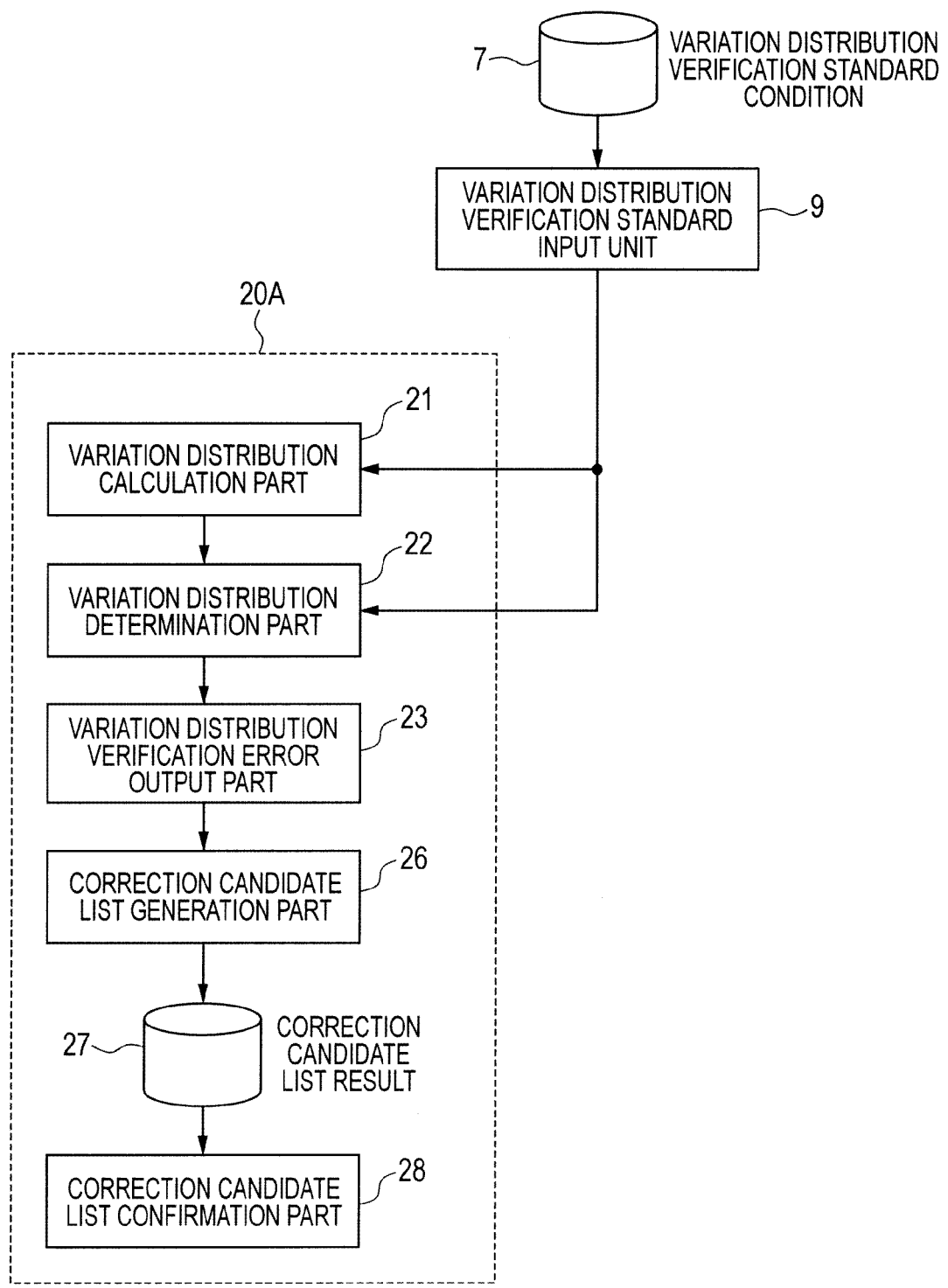
FIG. 9 is a diagram for describing the function of a simulation determination unit according to a second embodiment of the present invention.

FIG. 9 is a diagram for describing the function of a simulation determination unit according to a second embodiment of the present invention.

Referring to FIG. 9, the simulation determination unit 20A according to the second embodiment of the present invention includes a variation distribution calculation part 21, a variation distribution determination part 22, a variation distribution verification error output part 23, a correction candidate list generation part 26, a correction candidate list result storage part 27 and a correction candidate list confirmation part 28.

The variation distribution calculation part 21 and the variation distribution determination part 22 are similar to those described in FIG. 2.

The correction candidate list generation part 26 extracts an error point that needs a correction to cause a variation distribution to fall within a variation distribution verification error standard, based on an output result of the variation distribution verification error output part 23 and outputs list data about a correction candidate.

The correction candidate list result storage part 27 stores list data about correction candidates therein and stores therein information necessary for correction, such as coordinates of each error point that needs a correction to allow a variation distribution to fall within the standard, a degree of improvement by resolution of the corresponding error, etc. as the list data.

The correction candidate list confirmation part 28 confirms the correction candidate list stored in the correction candidate list result storage part 27. Concretely, the correction candidate list may be made visible and displayed on a display. These outputs may be used in subsequent stage tools such as P&R, etc.

Figure 10A:
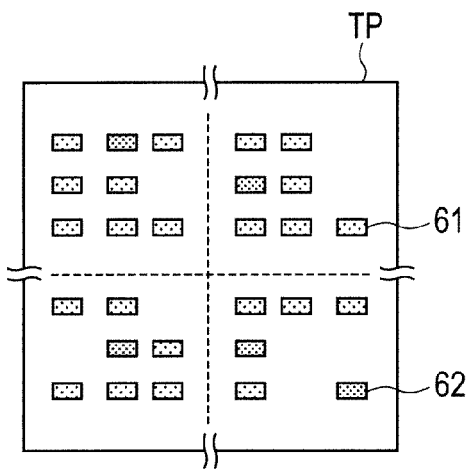
FIGS. 10(A), 10(B), 10(C), 10(D), 10(E) and 10(F) are respectively diagrams for describing the correction of error points according to the second embodiment of the present invention.

FIGS. 10(A), 10(B), 10(C), 10(D), 10(E) and 10(F) are respectively diagrams for describing the correction of each error point according to the second embodiment of the present invention. Referring to FIG. 10(A), there is shown here, a case where layout patterns of a plurality of transistors are formed in a chip TP. In the present example, there is shown a case in which normal transistors 61 and defective or fail transistors 62 are determined based on a simulation result.

Figure 10B:
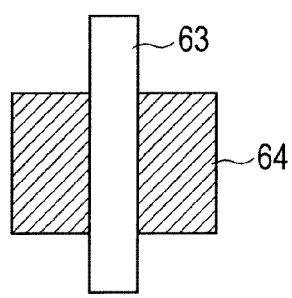
Figure 10C:
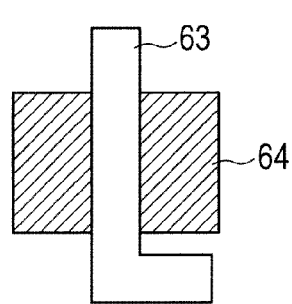
Figure 10D:
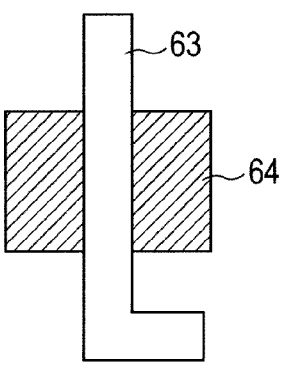

FIG. 10(B) is a diagram showing the normal transistor 61. FIG. 10(C) is a diagram showing the defective transistor 62. FIG. 10(D) is a diagram showing a correction transistor 65.

Referring to FIG. 10(B), an active region 64 and a conductive gate region 63 are shown. Referring to FIG. 10(C), there is shown here, a shape in which a conductive layer for a gate region 63 is bent and the distance between a bent portion and an active region 64 is short, and which is not defective in operation but determined to be defective in manufacture. That is, this shows where an error Δs is larger than an error standard ε.

On the other hand, referring to FIG. 10(D), there is shown here, a shape in which a conductive layer for a gate region 63 is bent and the distance between a bend portion and an active region 64 is long and which is corrected in distance and determined not to be defective in manufacture. That is, this shows where an error Δs is smaller than an error standard ε.

Figure 10E:
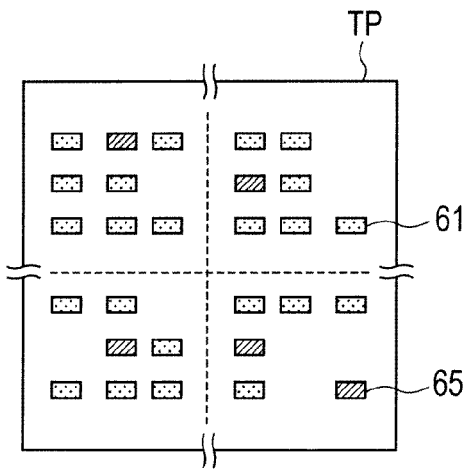

FIG. 10(E) is a diagram for describing the related-art correction of error points. As shown in FIG. 10(E), when error points are detected, defective transistors 62 have heretofore been modified or corrected to their corresponding correction transistors 65 until the detected error points all disappear.

Figure 10F:
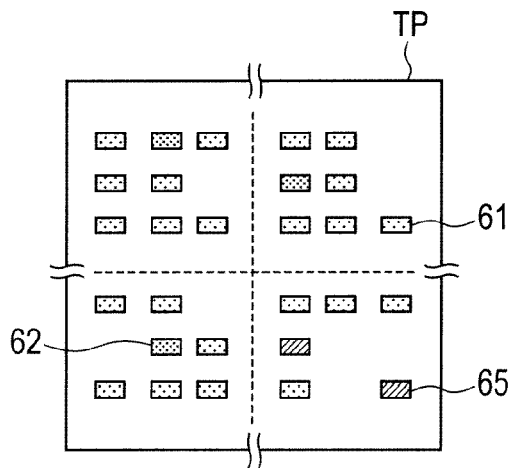

FIG. 10(F) is a diagram for describing the correction of each error point according to the embodiment of the present invention. In the method according to the second embodiment of the present invention, each error point is corrected to the correction transistor 65 of FIG. 10(D) until a variation distribution value D becomes smaller than an error standard δ without modifying or correcting all error points as shown in FIG. 10(F).

According to the method according to the second embodiment of the present invention, the number of corrections required can be reduced while suppressing the variation distribution over the entire chip TP by a necessary portion. It is thus possible to reduce loads such as design correction, changes in OPC/RET specs, etc.

Figure 11:
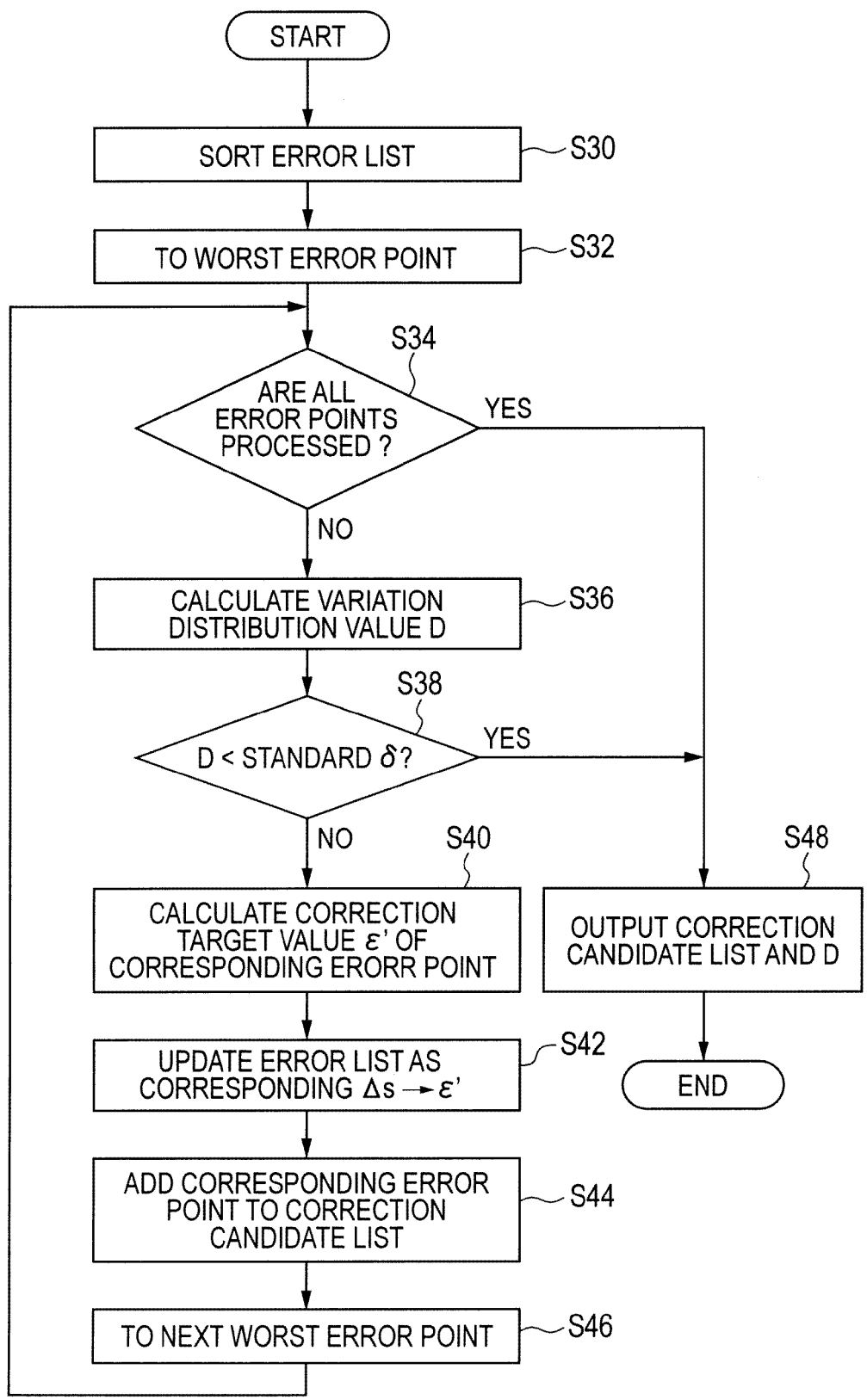
FIG. 11 is a diagram for describing a process at a correction candidate list generation part 26 according to the second embodiment of the present invention.

FIG. 11 is a diagram for describing processing by the correction candidate list generation part 26 according to the second embodiment of the present invention.

Referring to FIG. 11, an error list is first sorted (Step S30). Concretely, an error list is sorted according to the size of Δs and the like. If a verification type for lithography verification is taken here as a simulation dimension and a design layout dimension, for example, sorting is done in increasing order of errors Δs corresponding to these deviations.

Next, the worst error point at which a variation distribution is most extended is specified (Step S32).

It is next determined whether all error points have been processed (Step S34). When it is determined at Step S34 that all the error points have been processed (when the answer is YES at Step S34), the processing proceeds to Step S48.

At Step S48, a correction candidate list and a variation distribution value D are outputted (Step S48). Then, the processing is ended (END).

On the other hand, when it is determined that all the error points are not processed (when the answer is NO at Step S34), the processing proceeds to Step S36.

At Step S36, a variation distribution value D is calculated (Step S36). It is next determined whether the variation distribution value D falls within a variation distribution error standard δ (Step S38).

When it is determined at Step S38 that the variation distribution value D falls within the variation distribution error standard δ (when the answer is YES at Step S38), the processing proceeds to Step S48.

On the other hand, when it is determined at Step S38 that the variation distribution value D does not fall within the variation distribution error standard δ (when the answer is NO at Step S38), a correction target value ε' of the corresponding error point is calculated (Step S40).

Next, the error list is updated with the corresponding Δs as the correction target value ε' (Step S42).

The corresponding error point is added to the correction candidate list (Step S44). The next worst error point is specified (Step S46). The processing proceeds to Step S34. Then, the above processing is repeated.

That is, when the worst error point is specified and the variation distribution value D is calculated, it is determined whether the variation distribution value D falls within the variation distribution error standard δ. When the variation distribution value D does not fall within the variation distribution error standard δ, the worst error point is replaced with the correction target value, followed by being added to the correction candidate list. The corresponding processing is repeated until the variation distribution value D falls within the variation distribution error standard δ, thereby making it possible to generate the corresponding correction candidate list.

FIGS. 12(A) and 12(B) are respectively diagrams for describing updating of an error list according to the second embodiment of the present invention. Referring to FIG. 12(A), the corresponding error list is an error list similar to FIG. 5.

Incidentally, there is shown here, a case in which the column of the value of a correction target value ε' is further added to the error list of FIG. 5. In the present example, a fixed value is basically given as the value of the correction target value ε'.

Described concretely, when 1.5≦Δs, the correction target value ε' is set as 1.5. When Δs≦−1.5, the correction target value ε' is set as −1.5. When Δs falls within a range of −1.5<Δs<1.5, the correction target value ε' is set as the value of Δs.

Referring to FIG. 12(B), there is first shown a case in which sorting is done according to the size (absolute value) of Δs.

Here, the column ("final Δs") to be replaced with the correction target value ε' is provided.

Each worst error point is specified in accordance with the flow of FIG. 11. The first worst error point is "ID11". Δs of the corresponding point is assumed to be a correction target value ε'. Concretely, Δs is replaced with "1.5". It is then determined whether the variation distribution value D falls within the variation distribution error standard δ. When the variation distribution value D falls within the variation distribution error standard δ, the generation of a correction candidate list is ended. In the present example, there is shown a case where when similar processing is repeated until the variation distribution value D falls within the variation distribution error standard δ, and thereby ten error points are respectively replaced with correction target values ε', the variation distribution value D falls within the variation distribution error standard δ.

Here, there is shown, as one example, a case in which when the variation distribution value D=|μ|+3σ and the variation distribution error standard δ is "6", each error point is replaced with a correction target value until the variation distribution value D<within the variation distribution error standard δ is reached.

There is also shown a case where when the variation distribution error standard δ is assumed to be "5", each of error points is replaced with a correction target value until the variation distribution value D<within the variation distribution error standard δ is reached. In this case, there is shown a case in which when nineteen error points are replaced with correction target values ε', the variation distribution value D falls within the variation distribution error standard δ.

Thus, according to the corresponding method, the error points that exerts a large influence on the variation distribution are corrected or modified in priority manner without correcting all error points at which |Δs|>ε in the error list. Consequently, the number of corrections required can be decreased while suppressing the variation distribution of the entire chip TP by the necessary portion, thus making it possible to reduce loads such as design correction and changes in OPC/RET specs.

Third Embodiment

Figure 13:
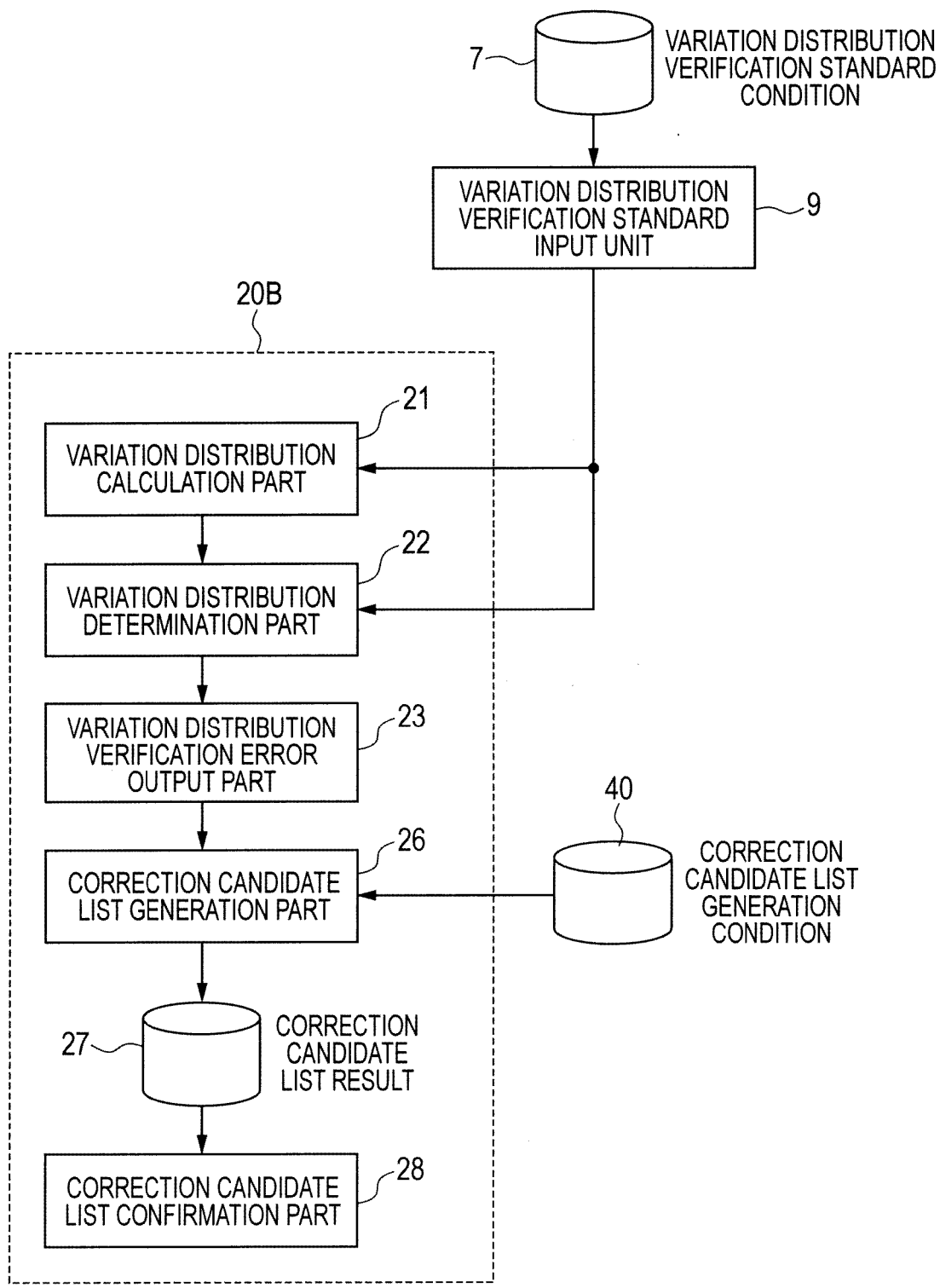
FIG. 13 is a diagram for describing the function of a simulation determination unit according to a third embodiment of the present invention.

FIG. 13 is a diagram for describing the function of a simulation determination unit according to a third embodiment of the present invention.

Referring to FIG. 13, the simulation determination unit 20B according to the third embodiment of the present invention includes a variation distribution calculation part 21, a variation distribution determination part 22, a variation distribution verification error output part 23, a correction candidate list generation part 26, a correction candidate list result storage part 27 and a correction candidate list confirmation part 28.

The present simulation determination unit 20B is different from the simulation determination unit of FIG. 9 in that a correction candidate list generation condition storage part 40 is provided, and a correction candidate list generation condition stored in the correction candidate list generation condition storage part 40 is inputted to the correction candidate list generation part 26.

Other respects are similar to those described in FIG. 9. The correction candidate list generation condition storage part 40 stores therein conditions for generating correction candidate lists. Concretely, upon generation of the correction candidate list, weighting parameters set according to circuit layout patterns are stored upon generation of the correction candidate list.

Figure 14:
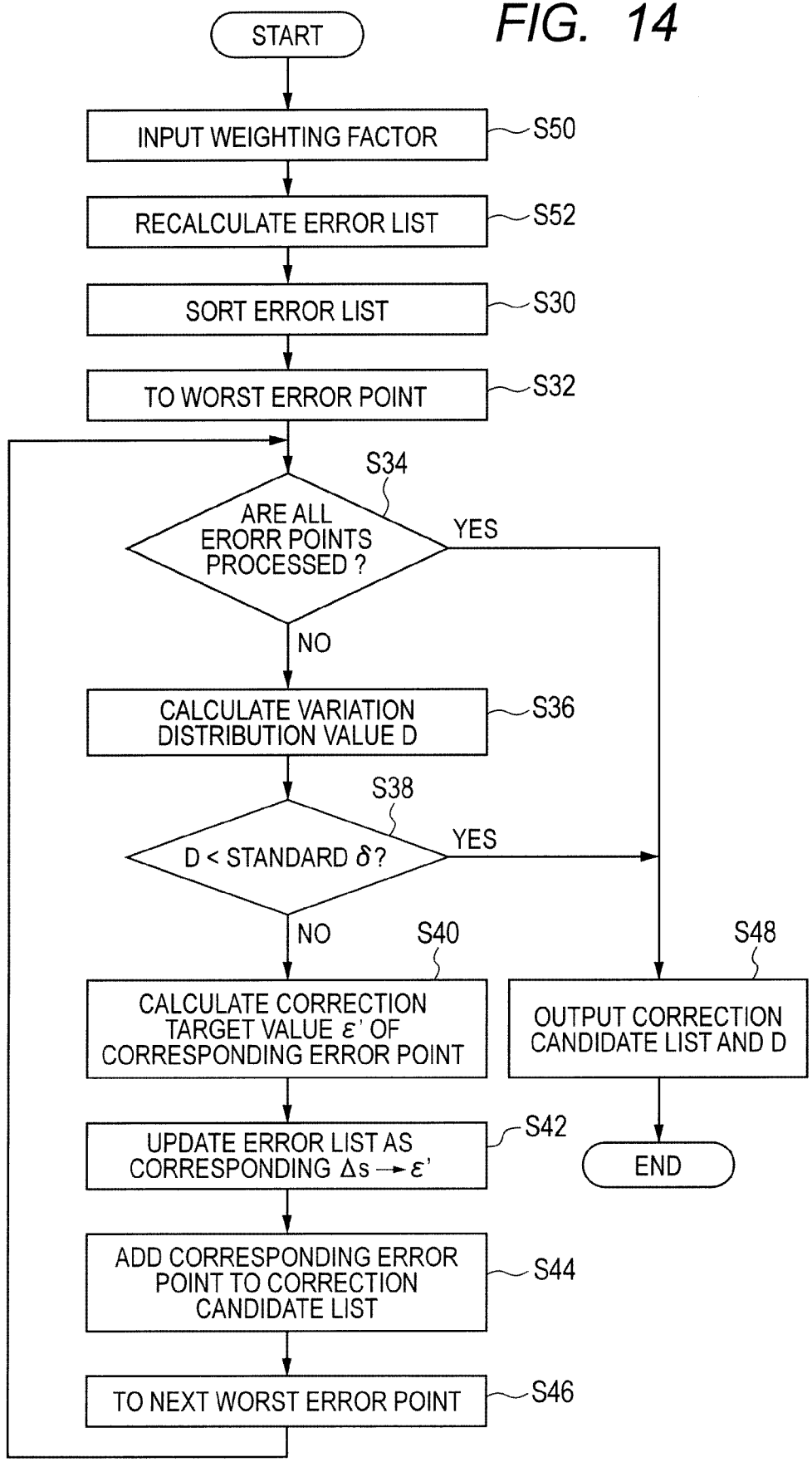
FIG. 14 is a diagram for describing a process at a correction candidate list generation part 26 according to the third embodiment of the present invention.

FIG. 14 is a diagram for describing processing by the correction candidate list generation part 26 according to the third embodiment of the present invention.

Referring to FIG. 14, a weighting factor (weighting parameter) is first inputted (Step S50).

Next, an error list is recalculated (Step S52). Concretely, the size of Δs or the like is multiplied by a weighting parameter W in the error list.

The error list is sorted (Step S30). Concretely, sorting is done in increasing order of |Δs|×W multiplied by weighting parameters.

Next, the worst error point at which a variation distribution is most extended is specified (Step S32). Since transition processing is similar to that described in FIG. 11, its detailed description will not be repeated.

FIGS. 15(A) and 15(B) are respectively diagrams for describing updating of the error list according to the third embodiment of the present invention. Referring to FIG. 15(A), the corresponding error list is shown in which the column of each weighting parameter W and the column of |Δs|×W are added to the error list of FIG. 12(A).

The weighting parameters W are stored in advance in the correction candidate list generation condition storage part 40 according to layout patterns. For example, layout patterns that need not to be corrected or are hard to be corrected may fall outside correction candidates with the weighting parameter W as "0".

Referring to FIG. 15(B), there is shown a case in which sorting is done according to the value of the size (absolute value) of Δs×W.

Here, the column ("final Δs") to be replaced with a correction target value ε' is provided.

Each worst error point is specified in accordance with the flow of FIG. 14. For example, the first worst error point is "ID21". Δs of the corresponding point is assumed to be a correction target value ε' const. Concretely, Δs is replaced with "1.5". It is then determined whether the variation distribution value D falls within the variation distribution error standard δ. When the variation distribution value D falls within the variation distribution error standard δ, the generation of a correction candidate list is ended. In the present example, there is shown a case in which when similar processing is repeated until the variation distribution value D falls within the variation distribution error standard δ, and thereby ten error points are respectively replaced with correction target values ε' const, the variation distribution value D falls within the variation distribution error standard δ.

Here, there is shown, as one example, a case in which when the variation distribution value D=|μ|+3σ and the variation distribution error standard δ is "6", each of error points is replaced with a correction target value until the variation distribution value D<within the variation distribution error standard δ is reached.

In the error list according to the second embodiment, the correction points necessary to reduce the variation distribution to within the variation distribution standard have been obtained as the correction candidate list. There was however no consideration as to whether they should be corrected on design and in consideration of the required accuracy of OPC/RET.

In the error list according to the third embodiment of the present invention, the weighting parameters are used to bring each of the error points upward by sorting as weighting becomes higher, whereby the error points can be corrected preferentially. Alternatively, each point hard to be corrected may be brought downward as for the candidate. That is, it is possible to reduce the weights of a functional block and a circuit not to be changed in terms of design and the accuracy of OPC/RET. In reverse, the weight of a point important in circuit operation like a transistor of a critical path can be set high.

Fourth Embodiment

Figure 16:
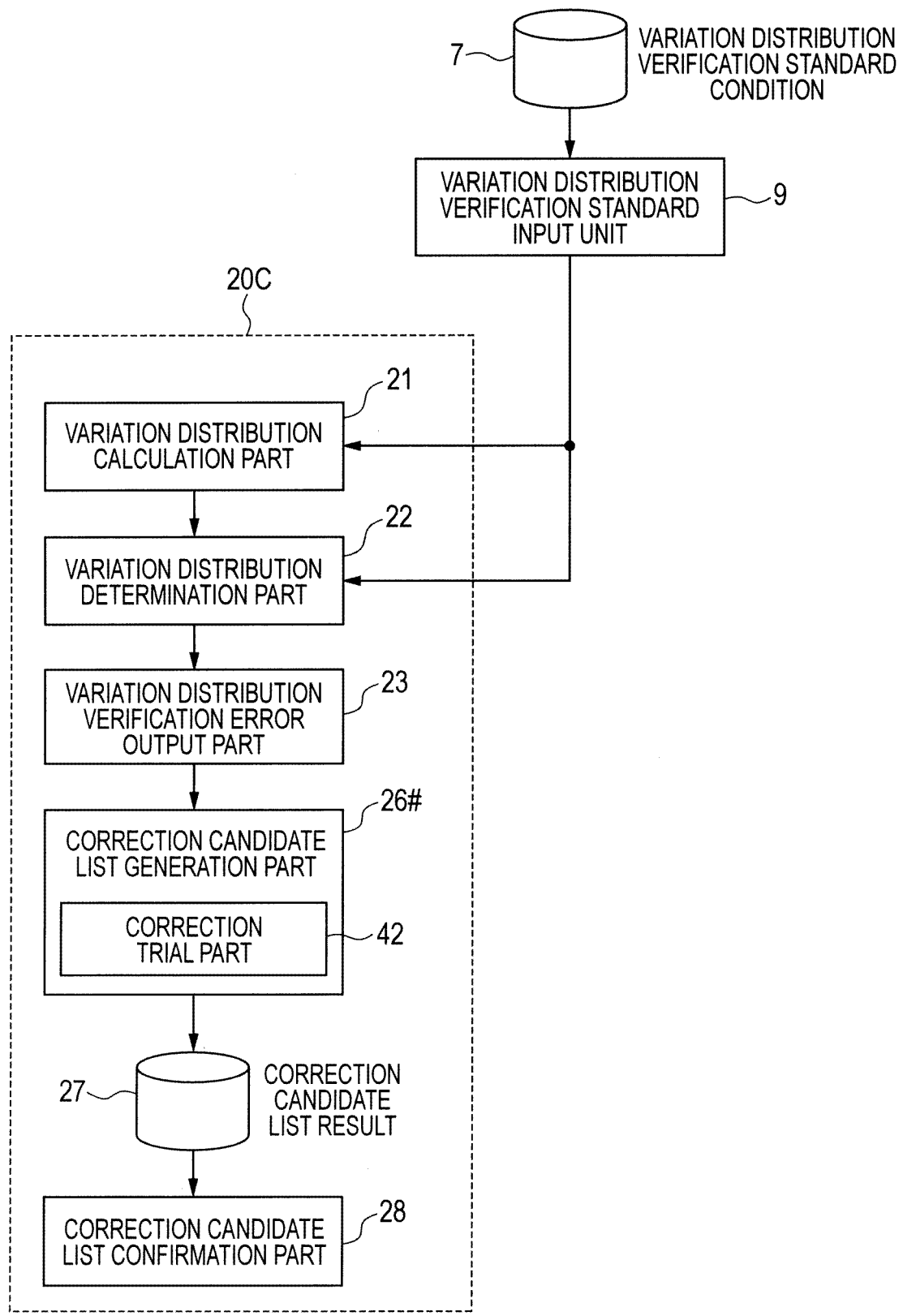
FIG. 16 is a diagram for describing the function of a simulation determination unit according to a fourth embodiment of the present invention.

FIG. 16 is a diagram for describing the function of a simulation determination unit according to a fourth embodiment of the present invention.

Referring to FIG. 16, the simulation determination unit 20C according to the fourth embodiment of the present invention includes a variation distribution calculation part 21, a variation distribution determination part 22, a variation distribution verification error output part 23, a correction candidate list generation part 26#, a correction candidate list result storage part 27 and a correction candidate list confirmation part 28.

The simulation determination unit 20C is different from the simulation determination unit 20A of FIG. 9 in that the correction candidate list generation part 26 is replaced with the correction candidate list generation part 26#.

The correction candidate list generation part 26# further includes a correction trial part 42. The correction trial part 42 is a part which tries to correct each error point in response to the output of the correction candidate list confirmation part 28. The correction trial part 42 is comprised of an error-point automatic correction tool or a P&R tool or the like for automatic correction on a rule base and lithography verification, or an interactive environment or the like an editor or an OPC/RET-spec based development environment. It is possible to realize an attempt or trial to correct each error point using, for example, a known tool (e.g., litho-correction tool (hotspot correction tool)).

FIG. 17 is a diagram for describing updating of an error list according to the fourth embodiment of the present invention. Referring to FIG. 17(A), the corresponding error list is shown in which the column of a correction target value ϵ' accu where each error Δs subjected to correction and trial by the correction trial part 42 is assumed to have been corrected, and the column of magnitude (|Δs|−|ϵ' accu|) of a difference amount obtained by subtracting a correction target value ϵ' accu from |Δs| are further provided in the error list of FIG. 12(A).

Referring to FIG. 17(B), there is shown a case in which sorting is done according to the magnitude (|Δs|−|ϵ' accu|) of the difference amount.

Here, the column ("final Δs") to be replaced with the correction target value ϵ' is provided. The correction target value ϵ' is not a fixed value but the value of a correction target value ϵ' accu tried by the correction trial part 42.

Each worst error point is specified in accordance with a method similar to the above flow. The first worst error point is "ID16". Then, Δs of the correspond point is assumed to be the correction target value ϵ' accu. Concretely, Δs is replaced with "−0.4". It is then determined whether the variation distribution value D falls within the variation distribution error standard δ. When the variation distribution value D falls within the variation distribution error standard δ, the generation of a correction candidate list is ended. In the present example, there is shown a case in which when similar processing is repeated until the variation distribution value D falls within the variation distribution error standard δ, and thereby fourteen error points are respectively replaced with correction target values ϵ' accu, the variation distribution value D falls within the variation distribution error standard δ.

Here, there is shown, as one example, a case in which when the variation distribution value D=|μ|+3σ and the variation distribution error standard δ is "6", each of error points is replaced with a correction target value until the variation distribution value D<within the variation distribution error standard δ is reached.

Referring to FIG. 17(C), there is shown here, a comparative example in which Δs is replaced with each correction target value ϵ' accu, based on the pre-sorting error list. There is shown here, a case in which when twenty three error points are replaced with their corresponding correction target values ϵ' accu, the variation distribution value D falls within the variation distribution error standard δ.

Thus, in the error list according to the fourth embodiment, the priority of a more accurate correction point can be decided by using each correction target value ϵ' accu as an alternative to ϵ'. Sorting in accordance with the magnitude of the amount of the difference enables correction of each correction point high in correction effect on a preferential basis. It is therefore possible to reduce correction process steps and execute correction processing at high speed.

Fifth Embodiment

Figure 18:
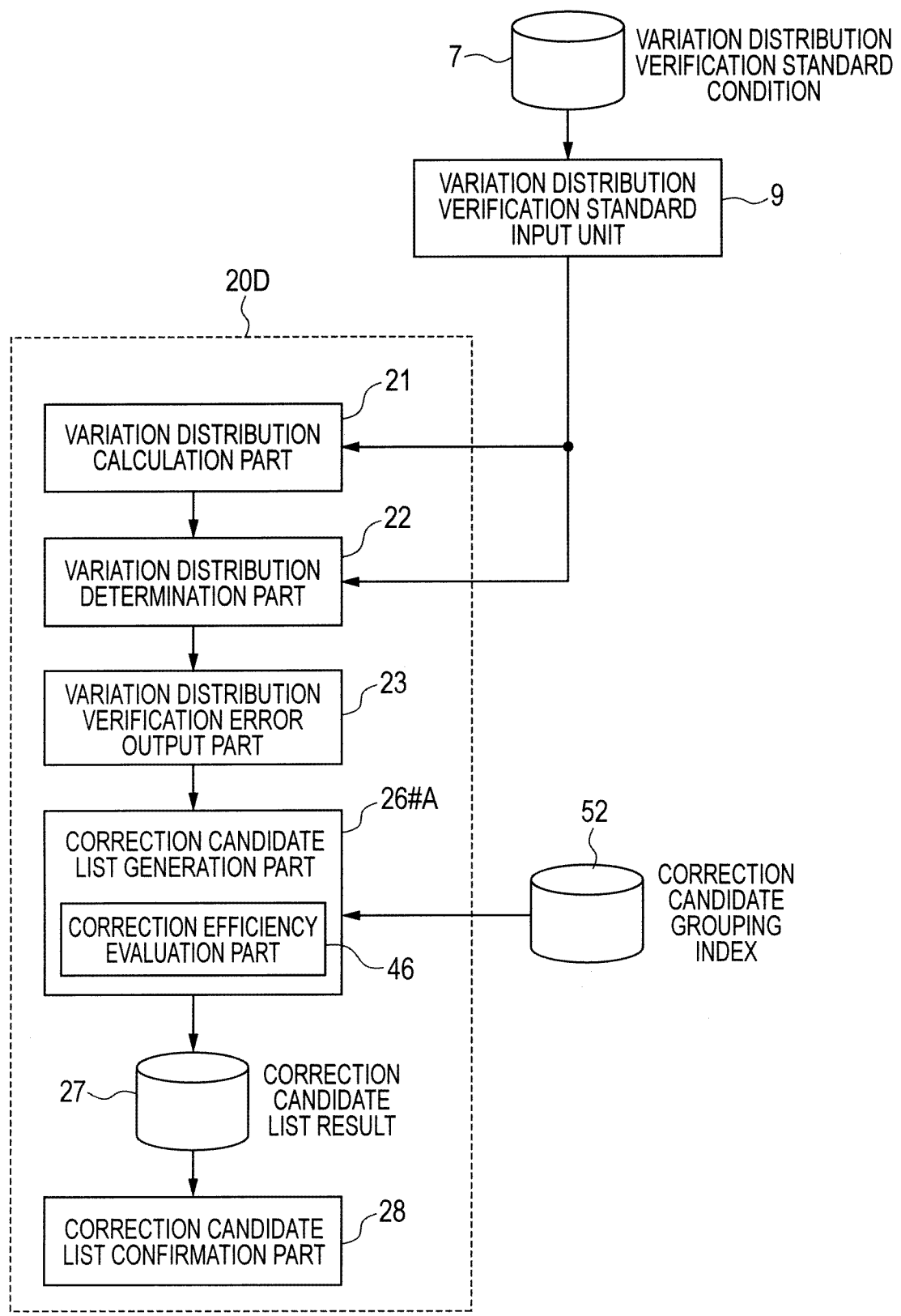
FIG. 18 is a diagram for describing the function of a simulation determination unit according to a fifth embodiment of the present invention.

FIG. 18 is a diagram for describing the function of a simulation determination unit according to a fifth embodiment of the present invention.

Referring to FIG. 18, the simulation determination unit 20D according to the fifth embodiment of the present embodiment includes a variation distribution calculation part 21, a variation distribution determination part 22, a variation distribution verification error output part 23, a correction candidate list generation part 26#A, a correction candidate list result storage part 27 and a correction candidate list confirmation part 28.

The simulation determination unit 20D is different from the simulation determination unit 20A of FIG. 9 in that the correction candidate list generation part 26 is replaced with the correction candidate list generation part 26#A.

The correction candidate list generation part 26#A further includes a correction efficiency evaluation part 46. The correction efficiency evaluation part 46 is a part for evaluating correction efficiency. The simulation determination unit 20D is also provided with a correction candidate grouping index storage unit 52 and different from the simulation determination unit 20A in that a correction candidate grouping index stored in the correction candidate grouping index storage unit 52 is inputted to the correction candidate list generation part 26#A.

Other respects are basically similar to those described in FIG. 9. The correction candidate grouping index storage unit 52 stores therein an index for providing one or similar correction. For example, there are provided indices such as cases in which a plurality of error points are the same cells, patterns are the same in shape in a region around the corresponding error point or similar in shape (so-called exact matching, pattern matching caused to have the degree of allowance, or the like), and error points become potential for becoming targets for the same processing with a layout correction tool or a tool such as OPC and for being capable of being resolved at a time by one setting change. For example, a pattern that coincides with (or similar to) a layout pattern registered in a library may be retrieved from a vast number of layout patterns so that the corresponding index be generated. Using the corresponding index enables grouping of correction candidates for the error list.

Figure 19:
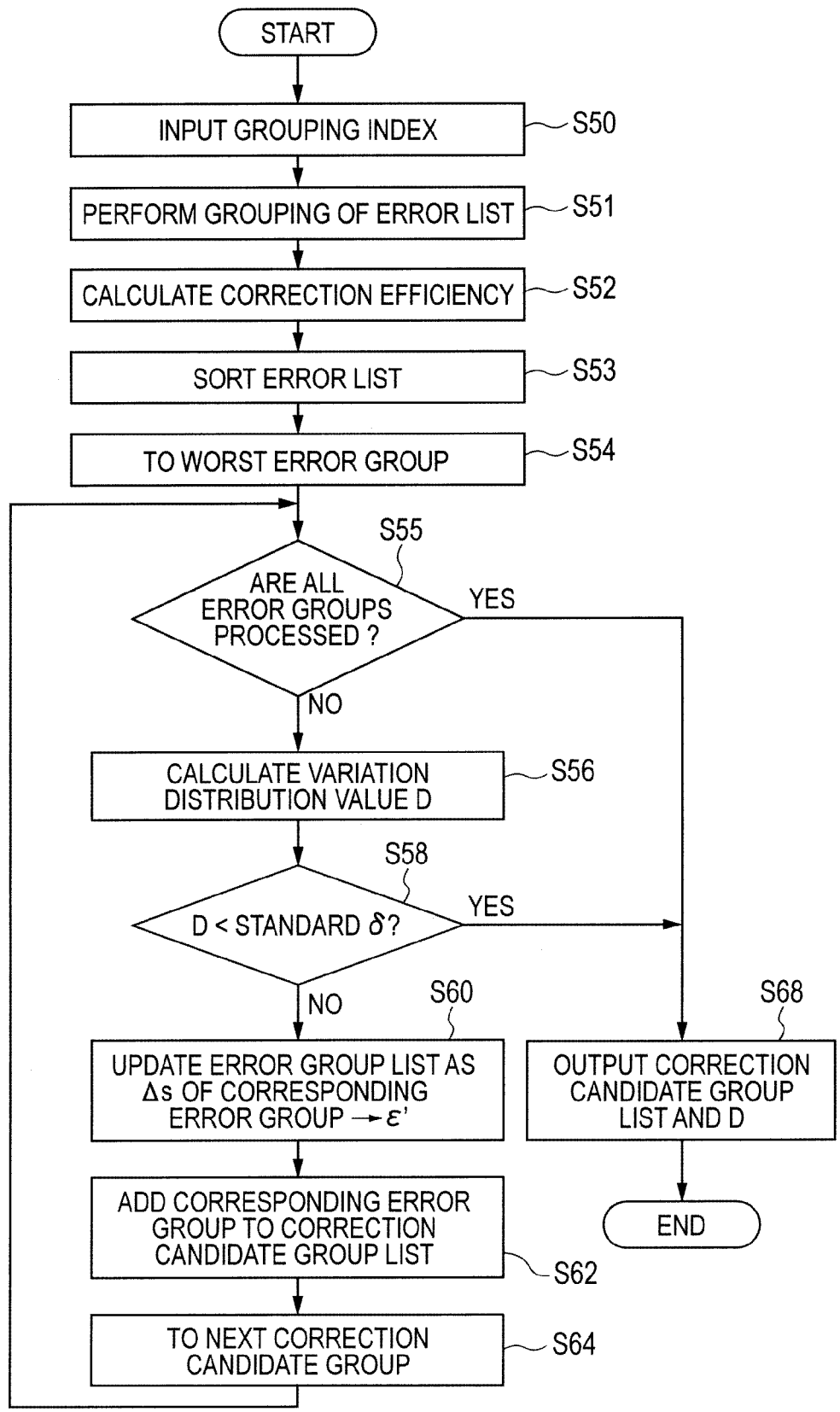
FIG. 19 is a diagram for describing a process at a correction candidate list generation part 26#A according to the fifth embodiment of the present invention.

FIG. 19 is a diagram for describing processing at the correction candidate list generation part 26#A according to the fifth embodiment of the present invention.

Referring to FIG. 19, a grouping index is first inputted (Step S50). Concretely, the corresponding grouping index stored in the correction candidate grouping index storage unit 52 is inputted.

Next, grouping is performed on the corresponding error list, based on the corresponding grouping index (Step S51). Next, correction efficiency for every group is calculated with respect to the error list subjected to the grouping (Step S52).

Concretely, the value of the sum (sumOfGrp) of magnitude (|Δs|−|ε' accu|) of difference amounts where Δs of the corresponding error group are taken as correction target values ε' is calculated.

Next, the error list subjected to the grouping is sorted in accordance with the value of the sum of the magnitude of the difference amounts (Step S53).

Next, the worst error group highest in correction efficiency is specified (Step S54).

It is next determined whether all error groups are processed (Step S55). When it is determined that all the error groups have been processed (the answer is YES at Step S55), the processing proceeds to Strep S68.

On the other hand, when it is determined that all the error groups have not yet been processed (the answer is NO at Step S55), a variation distribution value D is calculated (Step S56).

It is next determined whether the variation distribution value D falls within the variation distribution error standard δ (Step S58).

When it is determined at Step S58 that that variation distribution value D falls within the variation distribution error standard δ (the answer is YES at Step S58), the processing proceeds to Step S68.

Then, the corresponding correction candidate group list and the variation distribution value D are outputted (Step S68). On the other hand, when it is determined at Step S58 that the variation distribution value F does not fall within the variation distribution error standard δ (the answer is NO at Step S58), the corresponding error group list is updated with Δs of the corresponding error group as a correction target value ε' (Step S60).

The corresponding error group is added to a correction candidate group list (Step S62).

The following correction candidate group is specified (Step S64). Then, the processing proceeds to Step S55. The above processing is repeated.

That is, when the worst error group is specified and the variation distribution value D is calculated, it is determined whether the variation distribution value D falls within the variation distribution error standard δ. When the variation distribution value D does not fall within the variation distribution error standard δ, the entire worst error group is replaced with correction target values, followed by being added to the correction candidate group list. The corresponding correction candidate group list can be generated by repeating the corresponding processing until the variation distribution value D falls within the variation distribution error standard δ.

FIGS. 20(A) and 20(B) are respectively diagrams for describing updating of an error list according to the fifth embodiment of the present invention. Referring to FIG. 20(A), the corresponding error list is shown in which the error list of FIG. 12(A) is further provided with the column of a group ID based on the grouping index, and the column of magnitude (|Δs|−|ε' const|) of a difference amount obtained by subtracting a correction target value ε' const from |Δs|. The column of the value of the sum of magnitude (|Δs|−|ε' const|) of difference amounts set every group is also provided.

Referring to FIG. 20(B), there is shown a case in which the error list subjected to grouping is sorted in accordance with the total value of magnitude (|Δs|−|ε' const|) of difference amounts. Here, the columns ("finalΔs") to be replaced with the correction target values ε' are provided.

The worst error group is specified in accordance with the flow of FIG. 19. The first worst error point is "group ID7". Then, Δs of the correspond point is assumed to be a correction target value ε' const. Concretely, Δs is replaced with "1.5". It is then determined whether the variation distribution value D falls within the variation distribution error standard δ. When the variation distribution value D falls within the variation distribution error standard δ, the generation of a correction candidate group list is ended. In the present example, there is shown a case where when similar processing is repeated until the variation distribution value D falls within the variation distribution error standard δ, and thereby ten error points are respectively replaced with correction target values ε' const, the variation distribution value D falls within the variation distribution error standard δ.

Here, there is shown, as one example, a case in which when the variation distribution value D=|μ|+3σ and the variation distribution error standard δ is "6", each of error points is replaced with a correction target value until the variation distribution value D<within the variation distribution error standard δ is reached.

There is also shown a case in which when the variation distribution error standard δ is assumed to be "5", the error group is replaced with correction target values until the variation distribution value D<within the variation distribution error standard δ is reached. In this case, there is shown a case where when twenty four error points are replaced with correction target values ε' const, the variation distribution value D falls within the variation distribution error standard δ. Incidentally, the number of groups is 15.

Thus, in the error list according to the fifth embodiment, circuit layout patterns can be grouped and correction points in each group high in correction effect can be corrected preferentially. It is therefore possible to perform correction processing efficiently. Since it is possible to correct the correction points in a lump by grouping, correction efficiency can be further enhanced.

In the present example in particular, a description has been made of thirty error lists. An actual number is however vast and correction efficiency is dramatically enhanced.

Incidentally, although the correction target values ε' const have been processed as being fixed above with respect to the correction candidate group list, they may be calculated using the correction target values ε' accu tried by the correction trial part 42 as described in the fourth embodiment.

In the present example, the corresponding group high in variation distribution reduction effect, i.e., correction efficiency has been determined based on the total value of the magnitude ($|\Delta s|-|\epsilon'$ const$|$) of the difference amounts set every group. The present example is however not limited to it, but the group high in variation distribution reduction effect, i.e., correction efficiency may be specified and corrected based on another method. For example, the variation distribution reduction effect may actually be calculated in accordance with a predetermined function. Alternatively, a group high in correction efficiency may be specified using the sum of both an error value such as the number of errors in a group, the amount of dimensional displacement or the like and the product of the number of pieces, the sum of both a correction effect and the product of the number of pieces, or the like.

Sixth Embodiment

Although the above embodiments have described where the pass/fail of the lithography verification can be determined based on a statistical indicator or index obtained as a result of the integration of the individual lithography verification errors by verifying that the variation distribution falls within the error standard value, and the mask fabrication go/no-go decision or the like can be performed with a higher accuracy than the related-art case, the result of simulation of each individual error point has been assumed to converge uniquely.

On the other hand, since variations exist in physical values on an actual wafer, the individual error points also have variations between chips, between wafers and between lots, etc. A higher accurate simulation can be executed by simulation considering variations.

Figure 21:
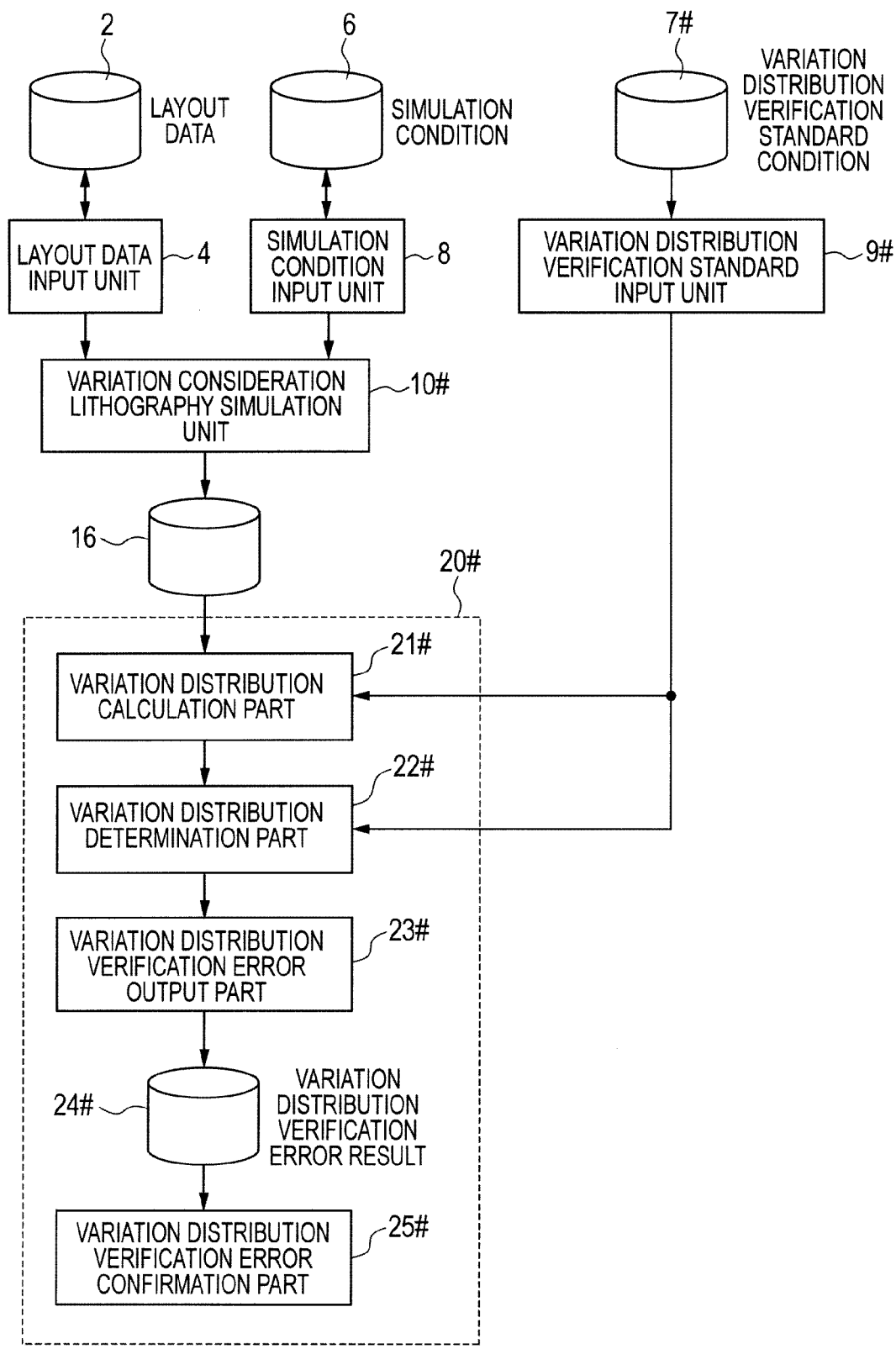
FIG. 21 is a main functional block diagram of a lithography verification apparatus according to a sixth embodiment of the present invention.

FIG. 21 is a main functional block diagram of a lithography verification apparatus according to a sixth embodiment of the present invention.

Referring to FIG. 21, the present functional block diagram differs from the functional block diagram described in FIG. 1 in that the lithography simulation unit 10 is replaced with a variation consideration lithography simulation unit 10#, and the simulation determination unit 20 is replaced with a variation consideration simulation determination unit 20#.

The variation consideration simulation determination unit 20# includes a variation distribution calculation part 21#, a variation distribution determination part 22#, a variation distribution verification error output part 23#, a variation distribution verification error result storage part 24# and a variation distribution verification error confirmation part 25#. There are also provided a variation distribution verification standard condition storage unit 7# and a variation distribution verification standard input unit #9.

The variation distribution verification standard condition storage unit 7# stores therein a variation distribution verification standard condition having considered the above variations. The corresponding condition is inputted to the variation distribution calculation part 21# and the variation distribution determination part 22#, where a calculation and a determination process having taken variations into consideration are carried out.

The variation consideration lithography simulation unit 10# is capable of performing simulation shown in Japanese Unexamined Patent Publication No. 2010-26076 to thereby determine not only center values of individual error points but also distribution values of physical values such as the dimensions of the error points, etc.

The variation consideration simulation determination unit 20# determines the so-obtained simulation results. Concretely, the variation distribution calculation part 21# calculates a variation distribution value D from the above-obtained center and distribution values of physical values. Although how to do the present calculation differs depending on how the distribution values of the physical values and the variation distribution value D are taken, the average value can easily be calculated by the known method, for example. Even when the distribution value is set to a standard deviation where the physical values follow a normal distribution, the distribution value can easily be calculated by a method which is generally widely performed based on the statistics. When the distribution value is calculated assuming that the physical values become a special distribution, a similar distribution is generated on a pseudo basis and calculated by the Monte Carlo method or a method similar to it to thereby make it possible to calculate the variation distribution value D. Subsequent processing can be performed by a method similar to those described in the above embodiments. A processing flow is also similar to the above.

Thus, a higher accurate simulation is performed by simulation having taken variations into consideration, thereby making it possible to further enhance the accuracy of lithography verification.

<Hardware Configuration>

The lithography verification apparatus according to each of the above embodiments is achieved by typically a computer-based apparatus.

Figure 22:
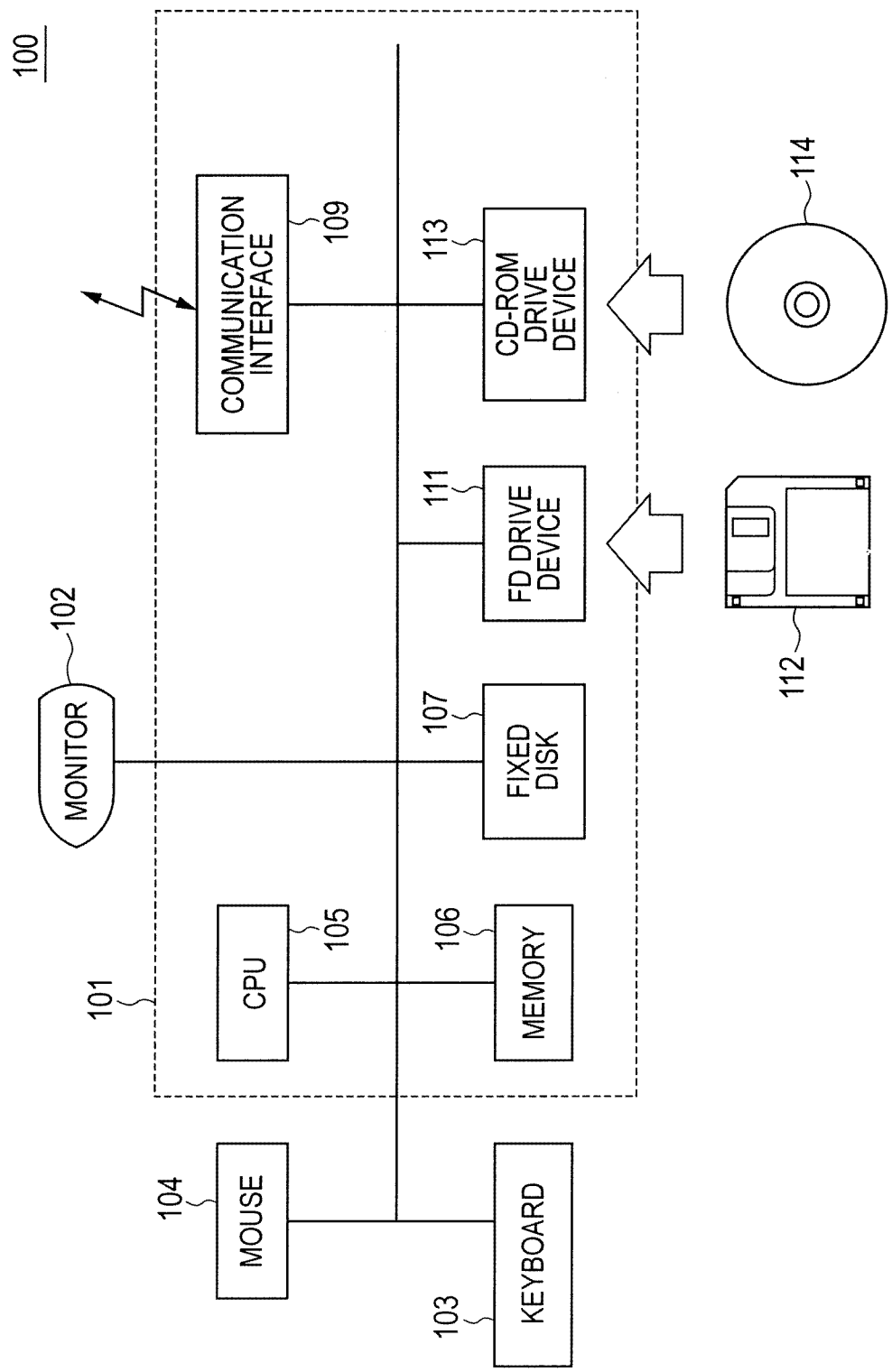
FIG. 22 is a schematic configuration diagram showing a hardware configuration of a computer 100, which is a typical hardware configuration for realizing the lithography verification apparatus according to the embodiment of the present invention.

FIG. 22 is a schematic configuration diagram showing a hardware configuration of a computer 100, which is a typical hardware configuration for realizing the lithography verification apparatus according to the embodiment of the present invention.

Referring to FIG. 22, the computer 100 includes a computer body 101 equipped with an FD (Flexible Disk) drive device 111 and a CD-ROM (Compact Disk-Read Only Memory) drive device 113, a monitor 102, a keyboard 103 and a mouse 104.

The computer body 101 includes a CPU (Central Processing Unit) 105 corresponding to an arithmetic unit, a memory 106, a fixed disk 107 corresponding to a storage device and a communication interface 109 interconnected by a bus, in addition to the FD drive device 111 and the CD-ROM drive device 113.

The lithography verification apparatus according to the present embodiment is realized by allowing the CPU 105 to execute a program using computer hardware such as the memory 106. In general, such a program is stored in recording media such as the FD 112 and the CD-ROM 114 or distributed through a network or the like. Such a program is read from the recording media by the FD drive device 111 and the CD-ROM drive device 113 or the like. Alternatively, the program is received by the communication interface 109 and stored in the fixed disk 107. Further, such a program is read from the fixed disk 107 to the memory 106 and executed by the CPU 105.

The CPU 105 is an arithmetic processing unit which performs various arithmetic and logic operations. The CPU 105 sequentially executes programmed instructions to thereby perform the above lithography verification. The memory 106 stores various information therein according to the program execution of the CPU 105.

The monitor 102 is a display unit for displaying information outputted by the CPU 105. The monitor 102 is comprised of an LCD (Liquid Crystal Display) or a CRT (Cathode Ray Tube) or the like as one example. That is, results of lithography verification and various applications are displayed on the monitor 102.

The mouse 104 accepts commands from a user, corresponding to operations such as a click, a slide, etc. The keyboard 103 accepts instructions from the user, corresponding to input keys.

The communication interface 109 is a device for establishing communications between the computer 100 and another apparatus and is capable of accepting various data from outside.

The embodiments disclosed this time are to be considered in all respects as illustrative and not restrictive. The scope of the present invention is indicated by the appended claims rather than by the foregoing description, and all changes which come within the meaning and range of the claims and equivalency thereof are intended to be embraced therein.

What is claimed is:

1. A lithography verification apparatus comprising:
a simulation execution unit which predicts a status value corresponding to a difference between a specification value of each of a plurality of layout patterns and a finished dimension thereof, based on layout data about the layout patterns to be formed over a wafer and a simulation condition including simulation parameters; and
a determination unit which calculates a variation distribution of the status values of the layout patterns, which are calculated by the simulation execution unit, and determines a simulation result, based on the calculated variation distribution,
wherein the determination unit comprises:
a calculation part which calculates the variation distribution of the status values of the layout patterns, and
an output part which compares the variation distribution value calculated by the calculation part and a predetermined value and thereby determines an error output, based on the result of the comparison.

2. The lithography verification apparatus according to claim 1,
wherein the simulation result comprises a plurality of status values respectively corresponding to the layout patterns, and
wherein the output part outputs an error list of the status values indicative of the simulation result.

3. The lithography verification apparatus according to claim 1,
wherein the simulation result comprises a plurality of status values respectively corresponding to the layout patterns,
wherein the output part comprises a list generation part which generates error lists indicative of the status values corresponding to the simulation result, and a correction list generation part which extracts a correction candidate out of the error lists generated by the list generation part to thereby generate a correction error list, and
wherein the correction list generation part repeats processing for correcting a status value target for correction at one of the error lists to a predetermined value, recalculating a variation distribution of the status values of the layout patterns using the calculation part, based on the corrected correction list, comparing a variation distribution value recalculated by the calculation part and the predetermined value to thereby determine whether a comparison result meets a predetermined condition, and correcting each of status values target for correction at the remainder of the error lists to a predetermined value until the comparison result meets the predetermined condition.

4. The lithography verification apparatus according to claim 3,
wherein the correction list generation part further comprises a weighting part which multiplies corresponding status values configuring each of the error lists by weighting factors respectively set in advance to the layout patterns in accordance with priorities on targets for correction before the extraction of a correction candidate and sets the so-multiplied values as status values.

5. The lithography verification apparatus according to claim 1,
wherein the simulation result comprises a plurality of status values respectively corresponding to the layout patterns,
wherein the output part comprises a list generation part which generates error lists indicative of the status values corresponding to the simulation result, and a correction list generation part which extracts a correction candidate out of the error lists generated by the list generation part to thereby generate a correction error list, and
wherein the correction list generation part repeats processing for estimating a status value changed when a corresponding pattern is corrected with respect to each of the status values of the error lists, correcting a status value target for correction at one of the error lists to the estimated status value, recalculating a variation distribution of the status values of the layout patterns using the calculation part, based on the corrected correction list, comparing a variation distribution value recalculated by the calculation part and the predetermined value to thereby determine whether a comparison result meets a predetermined condition, and correcting each of status values target for correction at the remainder of the error lists to an estimated status value until the comparison result meets the predetermined condition.

6. The lithography verification apparatus according to claim 1,
wherein the simulation result comprises a plurality of status values respectively corresponding to the layout patterns,
wherein the layout patterns are sorted into a plurality of groups,
wherein the output part comprises a list generation part which generates error lists indicative of the status values corresponding to the simulation result, and a correction list generation part which extracts a correction candidate out of the error lists generated by the list generation part to thereby generate a correction error list, and
wherein the correction list generation part repeats processing for performing sorting into the groups, based on the status values of the error lists to thereby calculate correction efficiency, correcting a status value target for correction at the group high in correction efficiency in the error lists to a predetermined value, recalculating a variation distribution of the status values of the layout patterns using the calculation part, based on the corrected correction list, comparing a variation distribution value recalculated by the calculation part and the predetermined value to thereby determine whether a comparison result meets a predetermined condition, and correcting each of status values target for correction at the remaining groups high in correction efficiency in the error lists to a predetermined value until the comparison result meets the predetermined condition.

7. A lithography verification apparatus, comprising:
a simulation execution unit which predicts a status value corresponding to a difference between a specification value of each of a plurality of layout patterns and a finished dimension thereof, based on layout data about the layout patterns to be formed over a wafer and a simulation condition including simulation parameters; and a determination unit which calculates a variation distribution of the status values of the layout patterns, which are calculated by the simulation execution unit, and determines a simulation result, based on the calculated variation distribution, wherein the simulation execution unit predicts a status value corresponding to a difference between a specification value and a finished dimension with respect to each of the layout patterns to be formed over the wafer, based on layout data about the layout patterns, variation information about the layout patterns, the simulation condition, and variation information about the simulation condition.

* * * * *